(12) United States Patent
Schnell et al.

(10) Patent No.: US 12,183,717 B2
(45) Date of Patent: Dec. 31, 2024

(54) SYSTEM AND METHOD FOR STACKING COMPRESSION ATTACHED MEMORY MODULES

(71) Applicant: DELL PRODUCTS L.P., Round Rock, TX (US)

(72) Inventors: Arnold Thomas Schnell, Hutto, TX (US); Joseph Daniel Mallory, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 200 days.

(21) Appl. No.: 17/863,205

(22) Filed: Jul. 12, 2022

(65) Prior Publication Data

US 2022/0344309 A1 Oct. 27, 2022

Related U.S. Application Data

(63) Continuation-in-part of application No. 16/935,852, filed on Jul. 22, 2020, now Pat. No. 11,394,141.

(51) Int. Cl.
*H01L 25/065* (2023.01)
*H10B 12/00* (2023.01)

(52) U.S. Cl.
CPC .......... *H01L 25/0657* (2013.01); *H10B 12/00* (2023.02)

(58) Field of Classification Search
CPC ....... H01L 25/0657; H01L 2225/06572; H01L 25/0652; H01L 25/0655; H01L 25/18; H10B 12/00; H05K 1/181; H05K 2201/10159; H05K 2201/10189; H05K 1/141; G06F 13/409; G06F 13/4068

USPC .................................................. 365/230.06
See application file for complete search history.

(56) References Cited

U.S. PATENT DOCUMENTS

| 6,358,064 B2 | 3/2002 | Szalay et al. |
| 6,545,895 B1 | 4/2003 | Li et al. |
| 7,200,023 B2 | 4/2007 | Foster, Sr. |
| 8,899,994 B2 | 12/2014 | Clayton et al. |
| 2006/0288132 A1 | 12/2006 | McCall et al. |
| 2013/0082398 A1 | 4/2013 | Crisp et al. |
| 2013/0135813 A1 | 5/2013 | Jimenez, III et al. |
| 2014/0065881 A1* | 3/2014 | Vinay .................... H05K 1/141 439/620.2 |
| 2014/0102626 A1 | 4/2014 | Clayton et al. |

(Continued)

FOREIGN PATENT DOCUMENTS

| WO | 2016175799 A1 | 11/2016 |
| WO | 2018236388 A1 | 12/2018 |

*Primary Examiner* — Fernando Hidalgo
(74) *Attorney, Agent, or Firm* — Larson Newman, LLP

(57) ABSTRACT

An information handling system includes a first z-axis compression connector having a first depth, a first memory module, a second z-axis compression connector having a second depth that is greater than the first depth, a second memory module, and a printed circuit board. A first side of the first compression connector is affixed to the printed circuit board at a first location and a first surface of a first memory circuit board of the first memory module is affixed to a second side of the first compression connector. A first side of the second compression connector is affixed to the printed circuit board at a second location adjacent to the first location and the first side of a second memory circuit board of the second memory module is affixed to a second side of the second compression connector.

20 Claims, 16 Drawing Sheets

(56) References Cited

U.S. PATENT DOCUMENTS

| | | |
|---|---|---|
| 2014/0104775 A1 | 4/2014 | Clayton et al. |
| 2017/0168528 A1 | 6/2017 | Ouyang et al. |
| 2019/0163565 A1 | 5/2019 | Meany et al. |
| 2021/0344130 A1* | 11/2021 | Li ..................... H01R 12/7076 |

* cited by examiner

Ground Coupling (Crosstalk)

Ground Coupling (Much Less Crosstalk)
(Pin-Based Contacts)

Ground Coupling (No Crosstalk)
(Spring-Based Contacts)

SYSTEM AND METHOD FOR STACKING COMPRESSION ATTACHED MEMORY MODULES

CROSS REFERENCE TO RELATED APPLICATIONS

This application is a Continuation-in-part of U.S. patent application Ser. No. 16/935,852 entitled "SYSTEM AND METHOD FOR STACKING COMPRESSION DUAL IN-LINE MEMORY MODULE SCALABILITY" filed Jul. 22, 2020, the disclosure of which is hereby expressly incorporated by reference in its entirety.

Related subject matter is contained in U.S. Pat. No. 11,074,952 entitled "System and Method for Compression Dual In-Line Memory Module Reversibility," issued Jul. 27, 2021, the disclosure of which is hereby incorporated by reference.

Related subject matter is contained in U.S. Pat. No. 11,321,009 entitled "System and Method for Compression Dual In-Line Memory Module Compressibility," issued May 3, 2022, the disclosure of which is hereby incorporated by reference.

FIELD OF THE DISCLOSURE

This disclosure generally relates to information handling systems, and more particularly relates to stacking of compression attached memory modules (CAMMs) in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a first z-axis compression connector having a first depth, a first memory module, a second z-axis compression connector having a second depth that is greater than the first depth, a second memory module, and a printed circuit board. A first side of the first compression connector may be affixed to the printed circuit board at a first location and a first surface of a first memory circuit board of the first memory module may be affixed to a second side of the first compression connector. A first side of the second compression connector may be affixed to the printed circuit board at a second location adjacent to the first location and the first side of a second memory circuit board of the second memory module may be affixed to a second side of the second compression connector.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items. As used herein, the terms "compression dual in-line memory module" and "cDIMM" may be understood to be equivalent to, and superseded by the terms "compression attached memory module" and "CAMM," respectively, as may be understood by persons skilled in the art.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
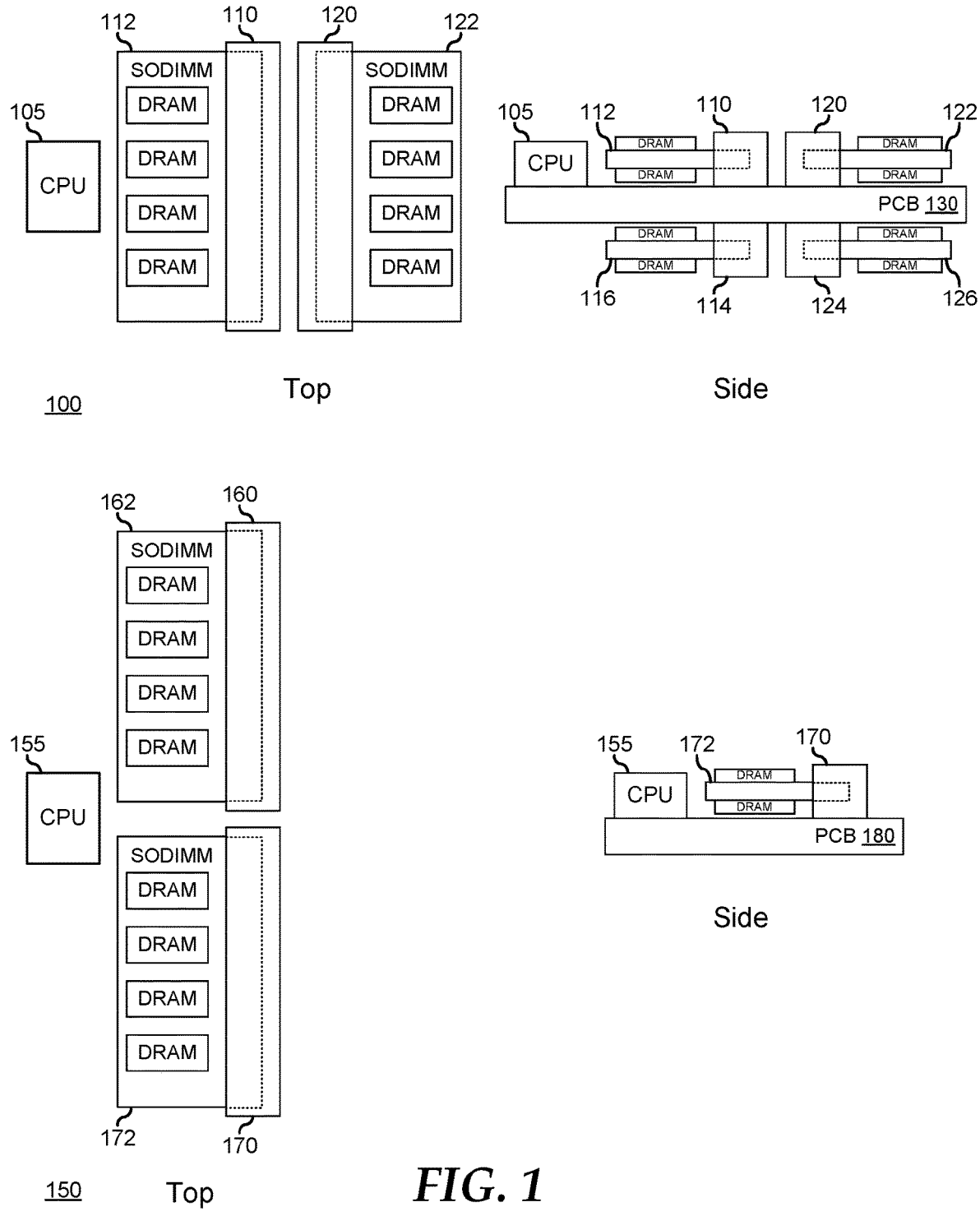
FIG. 1 includes block diagrams illustrating information handling systems as are known in the prior art.

FIG. 1 illustrates information handling systems 100 and 150 of the prior art. Information handling system 100 includes a processor (CPU) 105, and Small Outline Dual In-Line Memory Module (SODIMM) connectors 110, 114, 120, and 124 assembled onto a printed circuit board (PCB) 130. Connector 110 is populated with a SODIMM 112, connector 114 is populated with a SODIMM 116, connector 120 is populated with a SODIMM 122, and connector 124 is populated with a SODIMM 126. SODIMMs 112 and 116 are accessed by processor 105 via a first memory channel, and SODIMMs 122 and 126 are accessed by the processor via a second memory channel, as described further below. Information handling system 150 includes a processor 155, and SODIMM connectors 160, and 170 assembled onto a PCB 180. Connector 160 is populated with a SODIMM 162, and connector 170 is populated with a SODIMM 172. SODIMM 162 is accessed by processor 155 via a first memory channel, and SODIMM 172 is accessed by the processor via a second memory channel, as described further below.

SODIMMs 112, 116, 122, 126, 162, and 172 represent memory devices for use in information handling systems, and that are typically configured in smaller packages than normal DIMMS. As such, information handling systems 100 and 150 may typically be understood to represent various smaller form factor information handling systems, such as laptop computers, notebook computers, tablet devices, combination laptop/tablet systems, hand-held devices, and the like. SODIMMs 112, 116, 122, 126, 162, and 172 will each be understood to be provided in accordance with a particular Double Data Rate (DDR) standard, such as a third generation DDR standard (DDR3), a fourth generation DDR standard (DDR4), or a fifth generation DDR standard (DDR5). As such, processors 105 and 155 will be understood to be provided in accordance with a common DDR standard with the SODIMMs on the information handling system, and that all circuit layouts, configurations, and placements will be in accordance with the practices permitted or dictated by the particular DDR standard.

Information handling system 100 represents a configuration that typifies higher memory capacity but lower speed systems, as compared with information handling system 150 that represents a configuration that typifies lower memory capacity but higher speed systems. In particular, information handling system 100, having four SODIMMs 112, 116, 122, and 126, results in higher loading on each memory channel, meaning that more power is needed to assert signals on the memory channels, and thus lower speeds are achievable as compared with information handling system 150 that only has two SODIMMs 162 and 172, that is, only one SODIMM per memory channel. Here, in information handling system 100, even where not all of connectors 110, 114, 120, and 124 are populated with SODIMMs, the memory channels experience higher loading due to the stub effects of the unpopulated connectors, and so information handling system 100 will not typically operate at as high a speed as information handling system 150, even when populated similarly to information handling system 150. Moreover, connectors 110, 114, 120, 124, 160, and 170 are typically fashioned as some variety of plug-in or plug-and-lock connectors, and are not optimized for the highest data speeds that are envisioned for information handling systems in the future.

Further, the routing of signal traces in PCBs 130 and 180 are complicated. In particular, in information handling system 100, the signal traces, and particularly the signal trace lengths, for each SODIMM on a particular channel must be nearly identical. Thus, the implementation of information handling system 100 typically results in highly congested trace routes in PCB 130 in the vicinity of processor 105 and connectors 110, 114, 120, and 124, forcing other traces around the area of congestion, and resulting in higher PCB layer counts to accommodate the congestion. Moreover, where information handling system 150 may not need the trace crossings necessitated in information handling system 100, the implementation of information handling system 150 nevertheless suffers from the need to route traces over a wider area of PCB 180 to reach connectors 160 and 170. Moreover, particularly in the case of information handling system 100, a large portion of surface area of a PCB is used up by the placement of the connectors.

Figure 2:
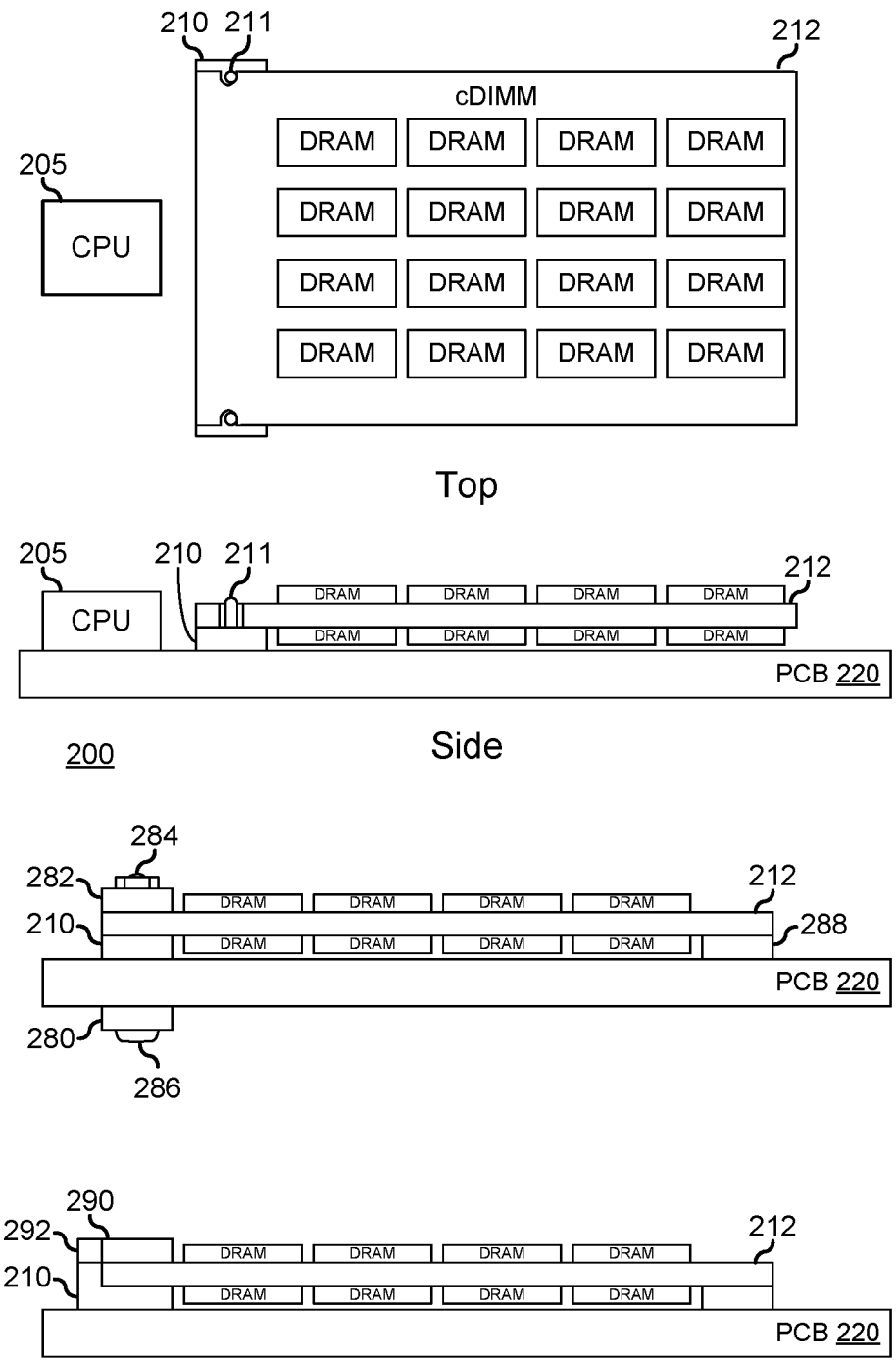
FIG. 2 includes block diagrams illustrating information handling systems according to an embodiment of the present disclosure.

FIG. 2 illustrates an information handling system 200 in accordance with an embodiment of the present disclosure. Information handling system 200 includes a processor 205, and a Compression Dual In-Line Memory Module (cDIMM) compression connector 210 assembled onto a PCB 220. Compression connector 210 is populated with a cDIMM 212. Compression connector 210 represents a z-axis, or "vertical," compression connector that provides a stand-off from PCB 220. Here, compression connector 210 includes separate metal contact elements on a top surface of the compression connector, one for each signal line and power line. Here, cDIMM 212 includes surface contact connections that are compressed to engage with the contact elements. Examples of compression connectors may include cStack or mezzanine-type connectors from Amphenol, PCBeam connectors from Neoconix, or the like. In a particular embodiment, cDIMM 212 is accessed by CPU 205 via both a first memory channel and a second memory channel through compression connector 210. In another embodiment, cDIMM 212 is accessed by CPU 205 via only one of the first memory channel or a second memory channel. However, in this embodiment, the use of only one memory channel may be based upon a design choice to provide a low-cost design. However, in this embodiment, it will be understood that compression connector 210 will still include contact elements associated with both memory channels, and cDIMM 212 will be configured to utilize only one of the memory channels. Compression connector 210 and cDIMM 212 include one or more complementary alignment mechanisms 211 that ensure the proper alignment of the cDIMM to the compression connector.

FIG. 2 further illustrates mechanical views of information handling system 200 of the attachment of cDIMM 212 to connector 210 in accordance with various embodiments. In a first embodiment, a backing plate 280 is attached at a bottom side of PCB 220 and a bolster 282 is placed on top of cDIMM 212. The contact connections of connector 210 are brought into firm contact with the surface contact connections of cDIMM 212 by tightening a nut 284 to a screw 286 fitted through backing plate 280, PCB 220, connector 210, cDIMM 212, and bolster 282. The screw and nut combination will be understood to be exemplary, and other through-hole attachment mechanisms may be utilized as needed or desired. In another embodiment, no backing plate is utilized, but the attachment mechanism interfaces directly with the bottom surface of PCB 220. In a particular case, bolster 284 may be fashioned as an L-shaped member to provide sufficient stiffness to the bolster to evenly maintain compression across the surface of connector 210. In a particular embodiment, connector 210 is surface mount attached (soldered) to the top surface of PCB 220, and cDIMM 212 is removable. In another case, connector 210 includes additional metal contact elements on a bottom surface, that is, the surface adjacent to PCB 220, and both the connector and cDIMM 212 are removable. Here, PCB 220 will include surface contact elements on a top surface of the PCB that are compressed to engage with the contact elements on the bottom side of connector 210. In yet another case, where cDIMM 212 is long, an additional support element 288 is provided to mechanically mount the cDIMM and to counter possible adverse effects from having the cDIMM cantilevered from connector 210. In a different embodiment, connector 210 includes a lever actuated compression device 290 with a lever 292. When lever 292 is in a locked position, lever actuated compression device 290 retains cDIMM 212, and when the lever is in an open position, the lever actuated compression device permits the removal of the cDIMM. The mechanical arrangements for attaching cDIMM 212 to connector 210, as described herein, will be understood to be exemplary and other mechanisms and arrangements for providing compression mounting of a cDIMM to a compression connector, as are known in the art, may be utilized in accordance with the teachings of the present invention.

Figure 3:
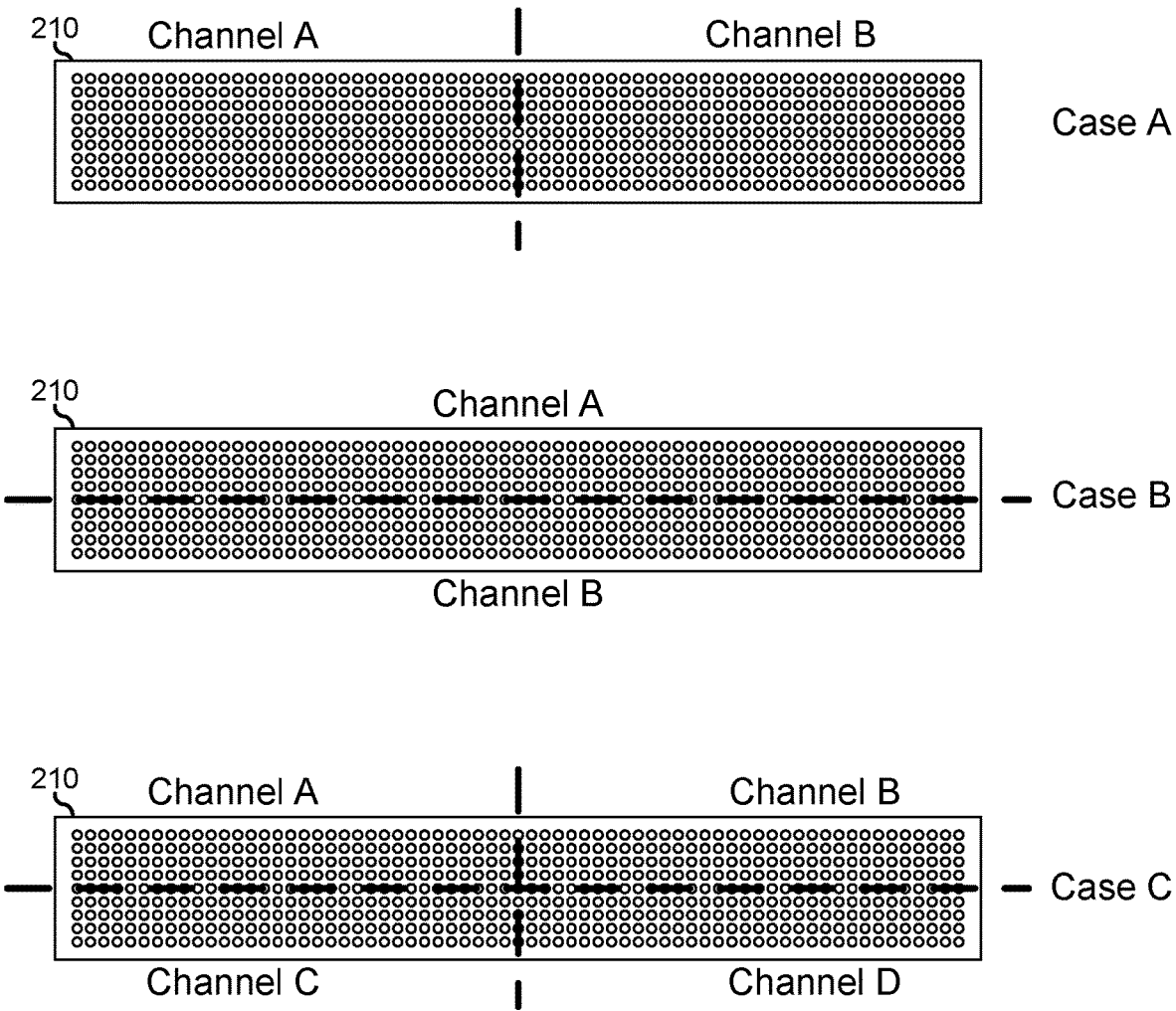
FIG. 3 illustrates a compression connector according to an embodiment of the present disclosure.

FIG. 3 illustrates connector 210 as arranged in various cases. In a particular embodiment, compression connector 210 includes a 9 row×67 column array of contact elements. In a first case, Case A, the signal contacts for a first memory channel (Channel A) are generally located in a left 33 columns and the signal contacts for a second memory channel (Channel B) are generally located in a right 33 columns. Here, a middle column may be utilized for common or symmetrical signal or power contacts. Here, it will be understood that the arrangement of the signal layout on a PCB for Channel A and Channel B will be mirror-images with respect to a middle column. In this way, compression connector 210 in particular, and the arrangement of compression connector 210 with cDIMM 212 may be reversible in a second aspect, so as to minimize the amount of signal trace crossings within PCB 220 when locating the compression connector and the cDIMM in various other orientations with respect to PCB 220, as will be described further below with reference to FIG. 8. In a second case, Case B, the signal contacts for a first memory channel (Channel A) are generally located in a top four rows and the signal contacts for a second memory channel (Channel B) are generally located in a bottom four rows. Here, a middle row may be utilized for common or symmetrical signal or power contacts. Here, it will be understood that the arrangement of the signal layout on a PCB for Channel A and Channel B will be mirror-images with respect to a middle row. In this way, compression connector 210 in particular, and the arrangement of compression connector 210 with cDIMM 212 may be reversible in a first aspect, so as to minimize the amount of signal trace crossings within PCB 220 when locating the compression connector and the cDIMM in various orientations with respect to PCB 220, as will be described further below with reference to FIG. 9. In a third case, Case C, where cDIMM 212 represents a fifth generation Double Data Rate (DDR5) cDIMM, the contact elements of compression connector 210 and the surface contact connections of the cDIMM include signaling for four memory channels. That is, each of the memory channel "A" and memory channel "B" are be divided functionally into two distinctly operating memory channels, hence memory channels A, B, C, and D. here, a first pairing of memory channels (e.g., A and B) will be mirror-images of a second pairing of memory channels (e.g., C and D) with respect to a middle column of the connector, and a third pairing of memory channels (e.g., A and C) will be mirror-images of a Fourth pairing of memory channels (e.g., B and D) with respect to a middle row of the connector.

Returning to FIG. 2, information handling system 200 is similar to information handling system 100, particularly in that information handling system 200 may represent the same memory capacity as information handling system 100. Here, SODIMMs 112, 126, 122, and 136 are each illustrated as including eight DRAM devices. It will be understood that the DRAM devices are illustrative, and that typical SODIMMs may include a different number of DRAM devices. Here, information handling system 100 will be understood to have a memory capacity associated with 32 DRAM devices, where the actual memory capacity is dictated by the density of the DRAM devices. However, where information handling system 100 utilizes four SODIMMs and four SODIMM connectors, information handling system 200 achieves the same memory capacity on a single cDIMM 212 and utilizing only one compression connector 210. Here, cDIMM 212 represents a memory device for use in information handling systems similarly to SODIMMs 112, 126, 122, and 136, and information handling system 200 may typically be understood to represent a smaller form factor information handling systems, such as a laptop computer, a notebook computer, a tablet device, a combination laptop/tablet system, a hand-held device, and the like. cDIMM 212 will be understood to be provided in accordance with a particular DDR standard, such as DDR3, DDR4, or DDR5, and processor 205 will be understood to be provided in accordance with a common DDR standard with the cDIMM.

Figure 4:
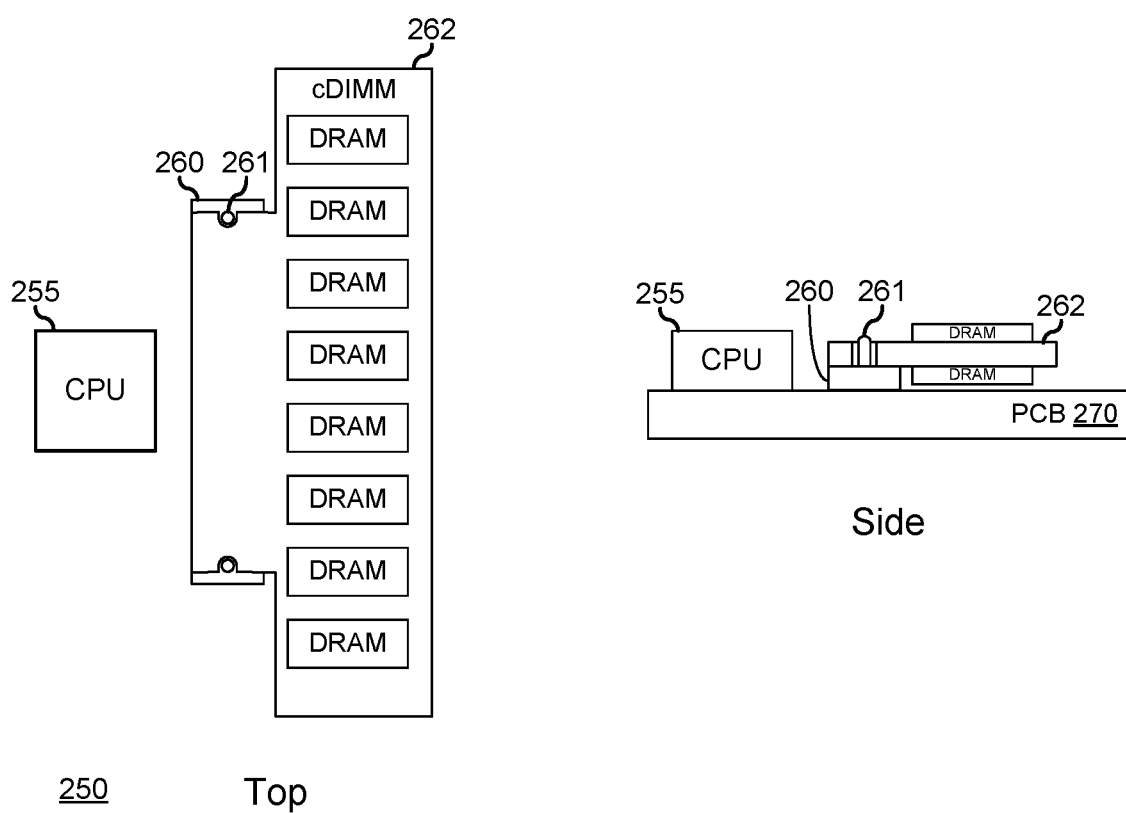
FIG. 4 includes block diagrams illustrating information handling systems according to an embodiment of the present disclosure.

FIG. 4 illustrates an information handling system 250 in accordance with an embodiment of the present disclosure. Information handling system 250 includes a processor 255 similar to processor 205, and cDIMM compression connector 210 assembled onto a PCB 270. Compression connector 210 is populated with a cDIMM 262. In a particular embodiment, compression connector 210 of a common type as compression connector 210, having a common profile, pin definitions, and the like. The mechanical attachment of cDIMM 262 to compression connector 210 is provided similarly to the attachment of cDIMM 212 to compression connector 210, as described above, and, in a particular embodiment, the compression connector and the cDIMM include one or more complementary alignment mechanisms 261 that ensure the proper alignment of the cDIMM to the compression connector. It will be further understood that cDIMM 262 is accessed by CPU 255 via both a first memory channel and a second memory channel through compression connector 210.

Information handling system 250 is similar to information handling system 150, particularly in that information handling system 250 may represent the same memory capacity as information handling system 150, where information handling system 150 has a same memory capacity as information handling system 250. However, where information handling system 150 utilizes two SODIMMs and two SODIMM connectors, information handling system 250 achieves the same memory capacity on a single cDIMM 262 and utilizing only one compression connector 210. Thus cDIMM 262 represents a memory device for use in information handling systems similarly to SODIMMs 162, and 176, and information handling system 250 may typically be understood to represent a smaller form factor information handling systems, such as a laptop computer, a notebook computer, a tablet device, a combination laptop/tablet system, a hand-held device, and the like. cDIMM 262 will be understood to be provided in accordance with a particular DDR standard, such as DDR3, DDR4, or DDR5, and processor 255 will be understood to be provided in accordance with a common DDR standard with the cDIMM.

Figure 5:
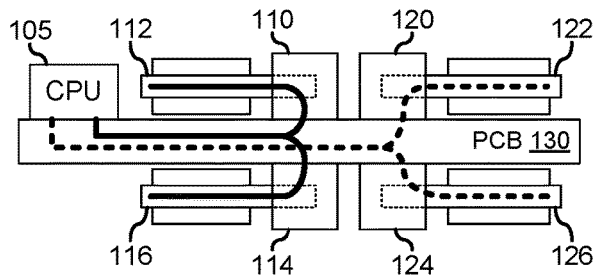
FIG. 5 illustrates comparisons of memory channels in the information handling systems of FIG. 1 with memory channels in the information handling systems of FIGS. 2 and 3.
Figure 5:
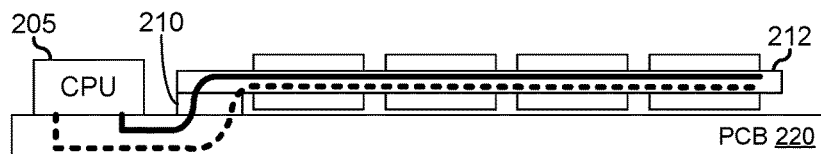
Figure 5:
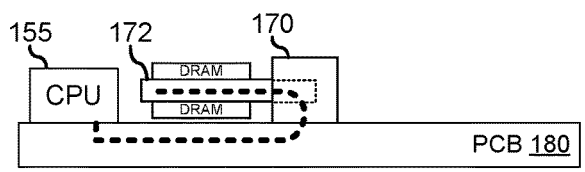
Figure 5:
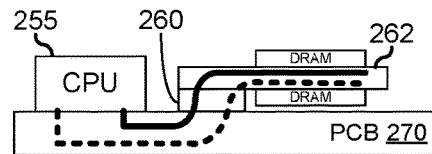

FIG. 5 illustrates memory channels as implemented by information handling systems 100, 150, as compared with memory channels as implemented by information handling systems 200, and 250. In all cases, a first memory channel (Channel A) is shown as a solid line and a second memory channel (Channel B) is shown as a dashed line. Information handling system 100 shows where SODIMMs 112 and 116 are accessed via the first memory channel and where SODIMMs 122 and 126 are accessed via the second memory channel. Note that the channel length on the first memory channel is similar for both of SODIMMs 112 and 116 and that the channel length on the second memory channel is similar for both of SODIMMs 122 and 126, and that the first memory channel has an overall length that is somewhat shorter than the second memory channel. In this configuration, connector 114 is affixed to PCB 130 below connector 110, and connector 124 is affixed to the PCB below connector 120. In this orientation the configuration of information handling system 100 results is extreme congestion and increase PCB layer counts to accommodate all of the signal traces on both memory channels to all four connectors. In contrast, information handling system 200 shows that both memory channels are routed through compression connector 210, and no swapping of signal traces is needed in the implementation of information handling system 200. In addition, the channel lengths for information handling system 200 will be significantly shorter than the channel lengths for information handling system 100, permitting higher speed operation on information handling system 200. Moreover, it will be understood that compression connector technology is more amenable to high-speed operation, with road maps showing support for up to 24 giga-byte (GB) transfer rates, while the plug-in or plug-and-lock type connectors typical for SODIMMs introduce unwanted capacitance and so are not considered suitable for higher data transfer rates. Note that the use of cDIMMs also simplifies the issue of reversibility, as will be described further below.

Information handling system 150 shows where SODIMM 172 is accessed via the second memory channel. Here, it will be understood that SODIMM 162 is accessed via the first memory channel, but is not shown due to SODIMM 162 residing behind SODIMM 172. Here, both memory channels have a same overall channel length. Note that, in information handling system 250, compression connector 210 is mounted closer to processor 255, as compared to the distance between connector 170 and processor 155 on information handling system 150, meaning that information handling system 250 has shorter channel lengths, meaning further that information handling system 250 will operate at higher speed as compared with information handling system 150. Moreover, the channel lengths in information handling system 250 are shorter than they appear in FIG. 5 due to the fact that compression connector 210 is mounted on PCB 270 in line with processor 255, as can be seen in the top-view of FIG. 4, while connectors 160 and 170 are mounted on PCB 180 at an offset from processor 155, as can be seen in the top-view of FIG. 1. Thus FIG. 5 illustrates that the routing of memory channels for cDIMMs is greatly simplified as compared with the equivalent routing for SODIMMs, and, usually leads to shorter memory channels as compared with SODIMMs.

Figure 6:
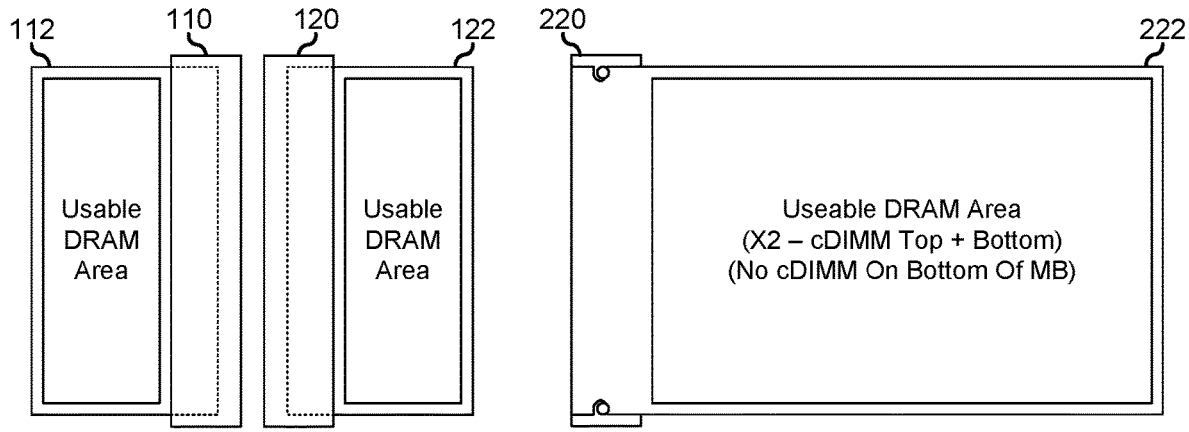
FIG. 6 illustrates comparisons of useable memory area in the information handling systems of FIG. 1 with useable memory area in the information handling systems of FIGS. 2 and 3.
Figure 6:
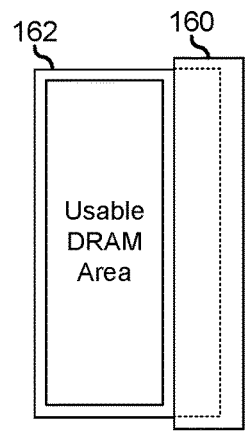
Figure 6:
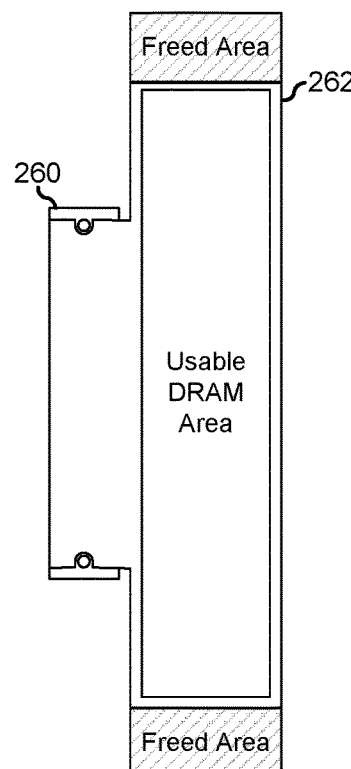

FIG. 6 illustrates memory area utilization as implemented by information handling systems 100, 150, 200, and 250. With respect to information handling systems 100 and 150, it will be understood that the memory areas on the bottom side of SODIMMs 112 and 122, and the memory areas associated with SODIMMs 116 and 126 are not illustrated, and that the memory areas on the top and bottom sides of cDIMM 212 is equivalent to the memory areas of the SODIMMs. However, in information handling system 200, no real estate is utilized for memory on the bottom side of the PCB. In addition, information handling system 200 gains the real estate area equivalent to three of connectors 110, 114, 120, and 124 because there is only one compression connector 210 on information handling system 200. Similarly, with respect to information handling systems 150 and 250, it will be understood that the memory areas on the bottom of SODIMMs 162 and 172 are not illustrated, and that the memory areas on the top and bottom sides of cDIMM 262 is equivalent to the memory areas of the SODIMMs. However, in information handling system 250, cDIMM 262 does not need to be as wide as the two SODIMMs 162 and 172, and that only one compression connector 210 is needed for information handling system 250 in the place of the two connectors 160 and 170 of information handling system 150.

Figure 7:
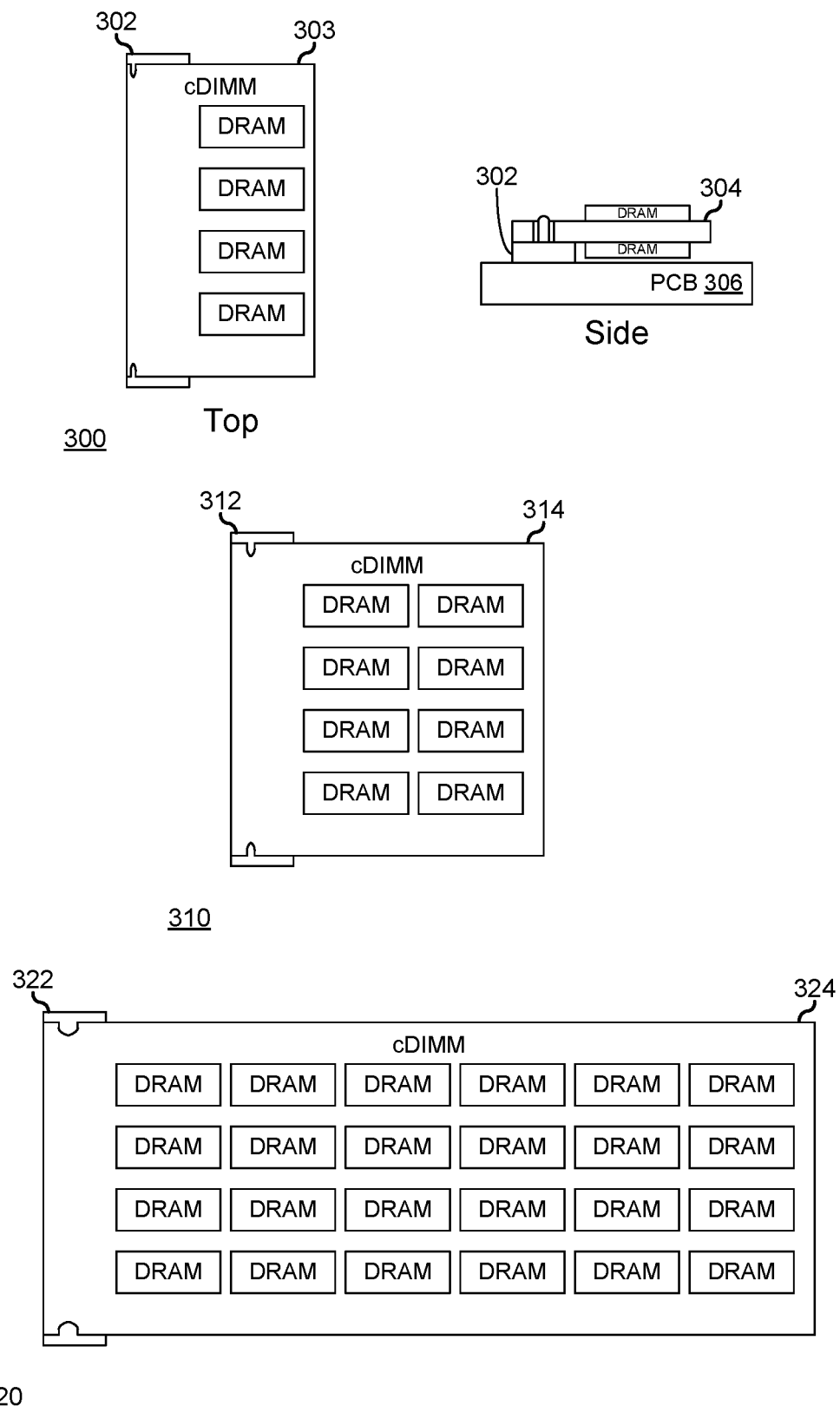
FIG. 7 includes block diagrams illustrating information handling systems according to other embodiments of the present disclosure.

FIG. 7 illustrates memory scalability utilizing cDIMMs in various configurations. In a particular embodiment, an information handling system 300 includes a cDIMM compression connector 302 mounted on a PCB 306, and into which a cDIMM 304 is populated. Here, cDIMM 304 represents a small capacity cDIMM, having half the usable area of cDIMM 262 as illustrated in FIG. 4. Information handling system 300 may be typical of a very small form factor information handling system, where the area of PCB 306 is highly constrained. Information handling system 300 may further be typical of a very high-performance information handling system, because the memory channels of cDIMM 304 are generally shorter than the memory channels of cDIMM 262. In another embodiment, an information handling system 310 includes a cDIMM compression connector 312 into which a cDIMM 314 is populated. Here, cDIMM 314 represents a cDIMM with a similar usable area to cDIMM 262, but arranged in a different footprint. In yet another embodiment, an information handling system 320 includes a cDIMM compression connector 322 into which a cDIMM 324 is populated. Here, cDIMM 324 represents a cDIMM high capacity cDIMM with a larger usable area than cDIMM 212 as illustrated in FIG. 2. Hence FIG. 4 illustrates that the use of cDIMMs is both more readily scalable than equivalent configurations that utilize SODIMMs, and that the configurations of cDIMMs are more flexible. For example, a cDIMM with an equivalent capacity to cDIMM 324 could be configured with the DRAMs arranged in three columns of eight DRAMs each, making a taller but shorter cDIMM configuration. Other configurations may be utilized as needed or desired.

Figure 8:
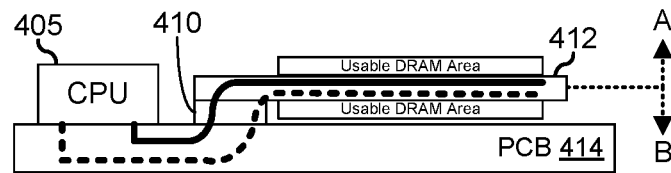
FIG. 8 includes block diagrams illustrating information handling systems according to other embodiments of the present disclosure.
Figure 8:
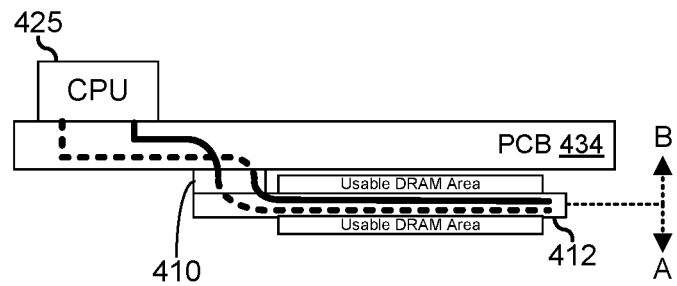
Figure 8:
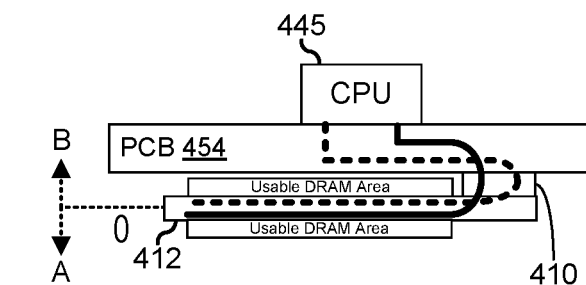

FIG. 8 illustrates memory reversibility utilizing cDIMMs and cDIMM compression connectors in various configurations utilizing signal layouts associated with Case A, as described above with respect to FIG. 2. In a particular embodiment, an information handling system 400 includes a processor 405, a cDIMM compression connector 410 mounted on a PCB 414, and into which a cDIMM 412 is populated. Information handling system 400 is similar to information handling systems 200 and 250, in that both memory channels are routed through compression connector 410. Note that the first memory channel is routed to an outside, or top side, of cDIMM 412, labeled side "A," and that the second memory channel is routed to an inside, or bottom side of the cDIMM, labeled side "B." Here, in terms of memory channel layout in PCB 414, and the initialization of cDIMM 412, such as during a Memory Reference Code (MRC) portion of a system boot process for information handling system 400, the configuration can be deemed a standard configuration.

In another embodiment, an information handling system 420 includes a processor 425, cDIMM compression connector 410 mounted on a PCB 434, and into which cDIMM 412 is populated. Here, compression connector 410 and cDIMM 412 have been inverted and mounted on the underside of PCB 434. Similarly to information handling system 400, both memory channels are routed through compression connector 410. However, because a memory channel layout as depicted in Case A, as described above with respect to FIG. 2 is arranged such that the memory channels are mirror-images with respect to a middle column of connector 410, no swapping of signal traces is needed in the implementation of information handling system 420. That is, the memory channel layout for information handling system 420 may be similar to the memory channel layout for information handling system 400, such that, where the contact pads in PCB 414 are on the top side of the PCB, the contact pads in PCB 434 are on the bottom side of the PCB. Note, however, that the first memory channel is routed to the inside of cDIMM 412 (side "B"), and that the second memory channel is routed to the outside of the cDIMM (side "A") in information handling system 420. Thus, in terms of memory channel layout, the standard configuration is suitable for both information handling system 400 and information handling system 420. It will be understood that the crossing of the memory channels on PCB 434 with cDIMM 412, as shown in information handling system 420 may be easily handled by slight reconfiguration of the MRC for information handling system 420 as compared with the MRC for information handling system 400. However, where the arrangement of the contact connections of cDIMM 412 are designed symmetrically between the memory channels, there may be no need for any changes in the MRC to accommodate the configuration of information handling system 420.

In yet another embodiment, an information handling system 440 includes a processor 445, cDIMM compression connector 410 mounted on a PCB 454, and into which cDIMM 412 is populated. Here, compression connector 410 and cDIMM 412 have not only been inverted and mounted on the underside of PCB 454, but also have been rotated 180 degrees on the surface of the PCB. As with information handling system 400 and information handling system 420, both memory channels are routed through compression connector 410. Again, because a memory channel layout as depicted in Case A, as described above with respect to FIG. 2 is arranged such that the memory channels are mirror-images with respect to a middle column of connector 410, no swapping of signal traces is needed in the implementation of information handling system 440. That is, the memory channel layout for information handling system 440 may be similar to the memory channel layout for information handling system 400, such that, where the contact pads in PCB 414 are on the top side of the PCB, the contact pads in PCB 454 are on the bottom side of the PCB. As such, the only difference between PCB 414 and PCB 454 may be that the memory channel vias in PCB 414 that make up the contact pads for compression connector 410 are routed to the top of PCB 414, while the memory channel vias in PCB 454 that make up the contact pads for the compression connector are routed to the bottom of PCB 454. Note here that the first memory channel is routed to the outside of cDIMM 412 (side "A"), and that the second memory channel is routed to the inside of the cDIMM (side "B"), and that the memory devices accessed by each memory channel are the same in information handling system 440 as in information handling system 400, and both information handling system 400 and information handling system 440 can use a common MRC. Thus, it will be noted that the use of cDIMMs greatly simplifies reversibility as compared with similar information handling systems that utilize SODIMMS.

Figure 9:
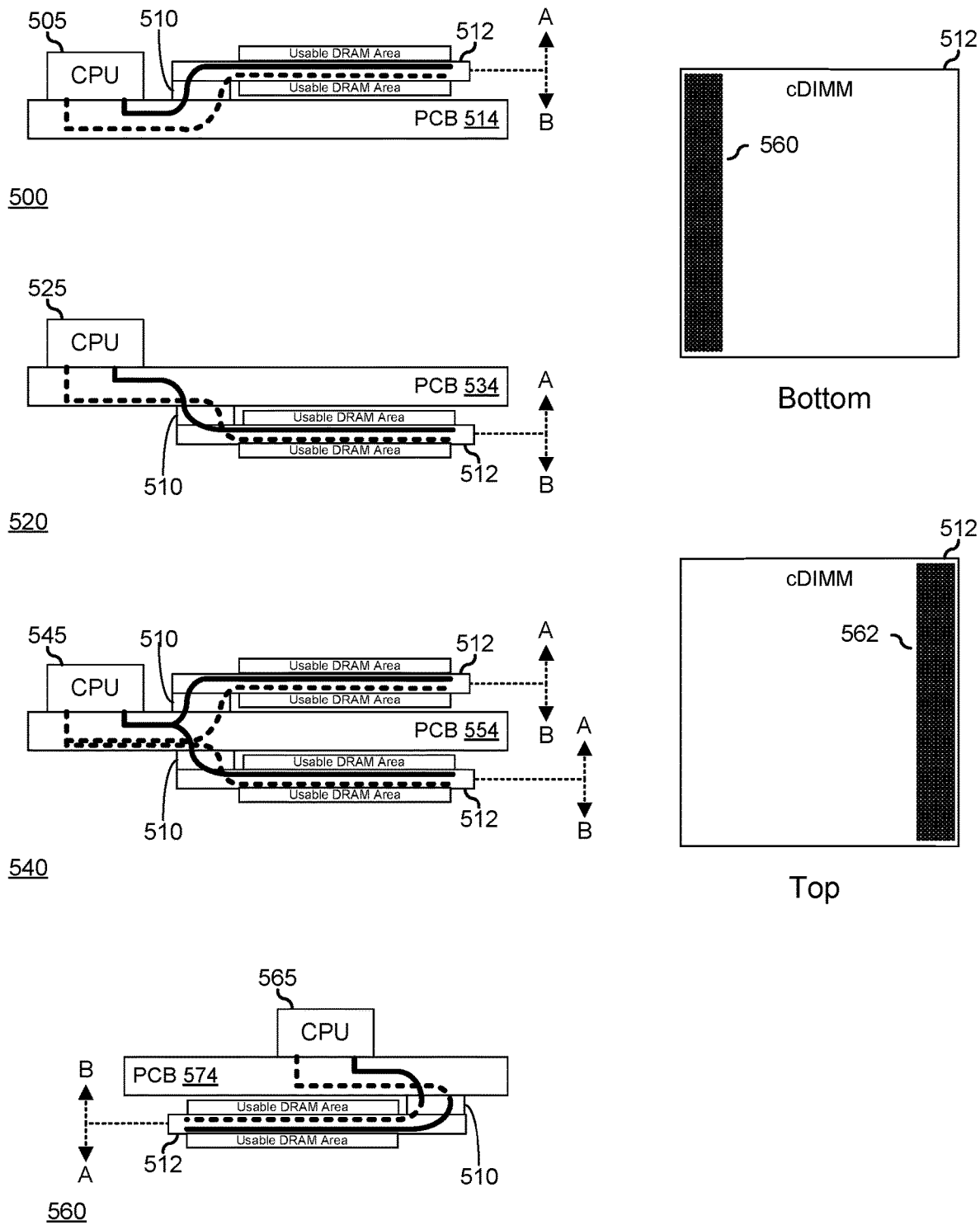
FIG. 9 includes block diagrams illustrating information handling systems according to other embodiments of the present disclosure.

FIG. 9 illustrates further memory reversibility utilizing cDIMMs and cDIMM compression connectors in various configurations utilizing signal layouts associated with Case B, as described above with respect to FIG. 2. Here, a cDIMM 512 is illustrated in a bottom view and in a top view. In the bottom view, cDIMM 512 is illustrated as having a contact array 560, as would be found on a bottom side of any of the previously described cDIMMs. In addition, in the top view, cDIMM 512 is illustrated as having a further contact array 562 on the top side of the cDIMM. Here, contact array 560 and contact array 562 will be understood to be arranged such that each contact in contact array 560 is directly in line with the associated contact in contact array 562. For example, a PCB of cDIMM 512 may be fabricated such that each contact in contact array 560 is directly connected to the associated contact in contact array 562 using a via between the top and bottom sides of the PCB.

In a particular embodiment, an information handling system 500 includes a processor 505, a cDIMM compression connector 510 mounted on a PCB 514, and into which cDIMM 512 is populated. Information handling system 500 is similar to information handling systems 200, 250, and 400, in that both memory channels are routed through compression connector 510, and information handling system 500 is arranged in the standard configuration. Here, cDIMM 512 is connected to compression connector 510 by contact array 560. Thus, the first memory channel is routed to an outside, or top side, of cDIMM 512, labeled side "A," and the second memory channel is routed to an inside, or bottom side of the cDIMM, labeled side "B." Further, the initialization of cDIMM 512, such as during a Memory Reference Code (MRC) portion of a system boot process for information handling system 500, can be in accordance with the standard configuration.

In another embodiment, an information handling system 520 includes a processor 525, cDIMM compression connector 510 mounted on a PCB 534, and into which cDIMM 512 is populated. Here, compression connector 510 and cDIMM 512 are mounted on the underside of PCB 534, but no left-to-right swapping is needed, because cDIMM 512 is connected to compression connector 510 by contact array 562 such that the first memory channel is routed to the inside of cDIMM 512 (side "A"), and that the second memory channel is routed to the outside of the cDIMM (side "B"). Thus, the memory channel layout for information handling system 520 may be identical to the memory channel layout for information handling system 500, except that, where the contact pads in PCB 514 are on the top side of the PCB, the contact pads in PCB 534 are on the bottom side of the PCB. As such, the only difference between PCB 514 and PCB 534 may be that the memory channel vias in PCB 514 that make up the contact pads for compression connector 510 are routed to the top of PCB 514, while the memory channel vias in PCB 534 that make up the contact pads for the compression connector are routed to the bottom of PCB 534.

In yet another embodiment, an information handling system 540 includes a processor 545, a pair of compression connectors 510, one mounted on a top side of a PCB 554, and the other mounted on a bottom side of the PCB, and into which a pair of cDIMMs 512 are mounted, one into the compression connector on the top side of the PCB, and the other into the compression connector on the bottom side of the PCB. Here, the memory channel routing may only differ in that the contacts in PCB 554 are connected together on the top and bottom sides of the PCB, such as by vias through the PCB.

In yet another embodiment, an information handling system 560 includes a processor 565, cDIMM compression connector 510 mounted on a PCB 574, and into which cDIMM 512 is populated. Here, compression connector 510 and cDIMM 512 have been inverted and mounted on the underside of PCB 574, and also have been rotated 180 degrees on the surface of the PCB. As with information handling system 500, information handling system 520, and information handling system 540, both memory channels are routed through compression connector 510. Again, because a memory channel layout as depicted in Case B, as described above with respect to FIG. 2 is arranged such that the memory channels are mirror-images with respect to a middle row of connector 510, the memory channel layout for information handling system 560 may be similar to the memory channel layout for information handling system 500, such that, where the contact pads in PCB 514 are on the top side of the PCB, the contact pads in PCB 574 are on the bottom side of the PCB. As such, the only difference between PCB 514 and PCB 574 may be that the memory channel vias in PCB 514 that make up the contact pads for compression connector 510 are routed to the top of PCB 514, while the memory channel vias in PCB 574 that make up the contact pads for the compression connector are routed to the bottom of PCB 574. Note here that the first memory channel is routed to the inside of cDIMM 512 (side "B"), and that the second memory channel is routed to the outside of the cDIMM (side "A"), and that the memory devices accessed by each memory channel are the different in information handling system 560 from information handling system 500. Thus, information handling system 560 may use a different MRC.

Thus, the arrangement of cDIMM 512, with contacts on a top and bottom side of the cDIMM, provides greater flexibility in the placement of cDIMMs within an information handling system, while allowing for a single arrangement for the memory channel traces in the PCB. That is, a common arrangement for memory channel traces within a PCB may admit to the placement of cDIMMs on a top side of the PCB, on the bottom side of the PCB, on both sides of the PCB, and rotated on the bottom side of the PCB, with only the placement of the contacts at the surface of the PCB being arranged differently. In fact, a layout that provides contacts on both the top side of the PCB and the bottom side of the PCB provides ultimate flexibility in cDIMM placement.

Figure 10:
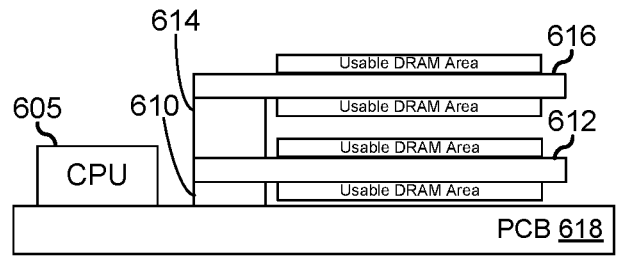
FIG. 10 includes block diagrams illustrating information handling systems according to other embodiments of the present disclosure.
Figure 10:
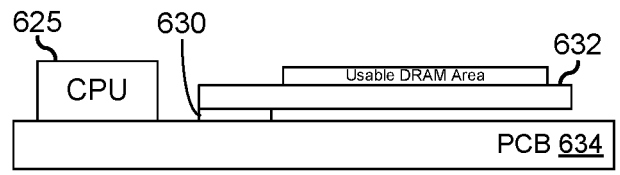
Figure 10:
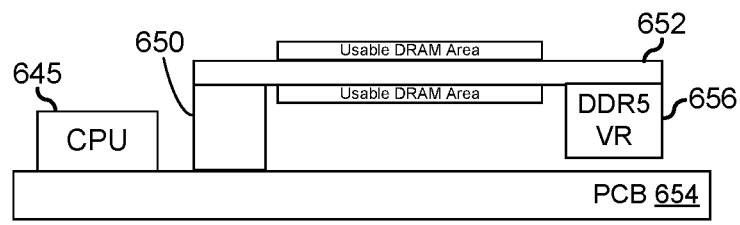
Figure 10:
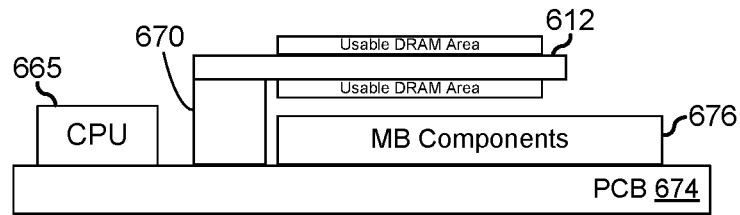

FIG. 10 illustrates the use of cDIMMs in various configurations. In a first embodiment, an information handling system 600 includes a processor 605, a pair of cDIMM compression connectors 610 and 614, and a pair of cDIMMs 612 and 616. Here, compression connector 610 is mounted to a PCB 614, into which cDIMM 612 is installed. Here, cDIMM 612 is similar to cDIMM 512 of FIG. 9, having contact arrays on both the top side and the bottom side of the cDIMM. Compression connector 614 is then mounted to the top side of cDIMM 612, into which cDIMM 616 is mounted. Here, cDIMM 616 may be similar to cDIMM 512, or may be similar to cDIMM 412 of FIG. 8, having a contact array on only the bottom side of the cDIMM. Note here that the depth of compression connector 612 is similar to compression connectors 210, 410, and 510, and is typically provided with a depth that allows for the DRAMs on the bottom side of cDIMM 612 to clear PCB 618, and may be sufficient to permit air to flow around the DRAMs, as needed or desired. In this regard, the depth of compression connectors 210, 410, 510, and 610 may be considered to be a standard dimension. On the other hand, compression connector 614 may be provided with a depth that allows for DRAMs on the top side of cDIMM 612 to clear the DRAMs on the bottom side of cDIMM 616, and may be sufficient to permit air to flow around the DRAMs, as needed or desired. In this regard, the depth of compression connector 614 will be understood to be different from the dimension of compression connector 610.

FIG. 10 further illustrates different embodiments of information handling systems with varying depths of cDIMM compression connectors. Information handling system 620 includes a processor 625 and a cDIMM compression connector 630 mounted onto a PCB 634, and into which a cDIMM 632 is installed. Compression connector 630 represents a reduced depth compression connector that may be suitable where, as illustrated, cDIMM 634 is only populated with DRAMs on a top side of the cDIMM. Here, compression connector 630 is provided with a sufficient depth to clear PCB 634. Thus, information handling system 620 permits a reduced overall depth typical for use in ultra-slim devices. Information handling system 640 includes a processor 645 and a cDIMM compression connector 650 mounted onto a PCB 654, and into which a cDIMM 652 is installed. Compression connector 630 represents an increased depth compression connector. Here, cDIMM 654 is a DDR5 cDIMM that includes an on-board voltage regulator (VR) 656 device that may typically have a higher profile than the DRAMs on the cDIMM. Thus compression connector 650 has an increased depth to accommodate VR 656. Information handling system 660 includes a processor 665 and a cDIMM compression connector 670 mounted onto a PCB 674, and into which a cDIMM 672 is installed. Compression connector 630 represents an increased depth compression connector to accommodate for the placement of various motherboard components 676 on PCB 674.

Figure 11:
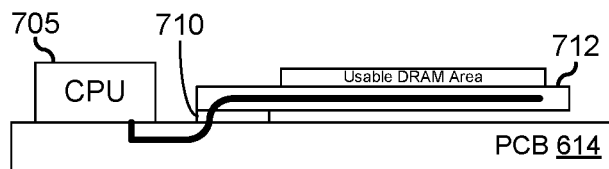
FIG. 11 includes block diagrams illustrating information handling systems according to further embodiments of the present disclosure.
Figure 11:
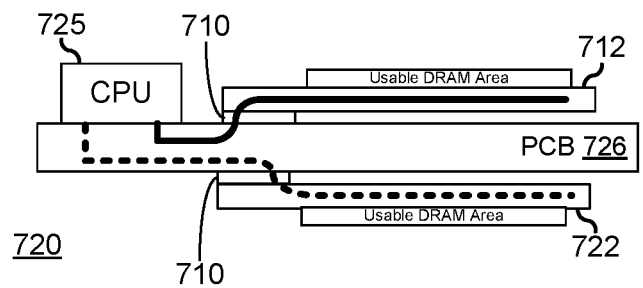
Figure 11:
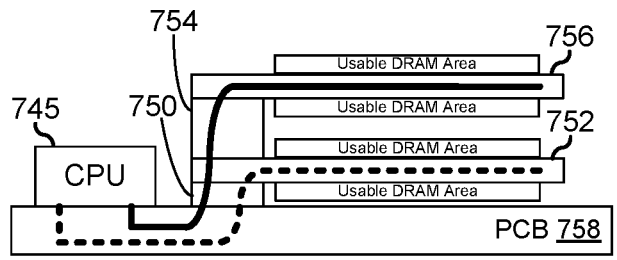

FIG. 11 illustrates the use of cDIMMs that are arranged to only utilize one memory channel, while remaining compatible with cDIMM compression connectors that provide contact elements for two memory channels. In a particular embodiment, an information handling system 700 includes a processor 705, a cDIMM compression connector 710 mounted on a PCB 714, and into which a cDIMM 712 is populated. Information handling system 700 is similar to information handling systems 200 and 250, in that both memory channels are routed through compression connector 410. However, here, cDIMM 712 is arranged such that only the contact connections associated with a single memory channel, here illustrated as the first memory channel, are used. Here, the array of contact connections on cDIMM 712 may include contact connections for both memory channels. However, it will be understood that the DRAMs on cDIMM 712 are only accessed via a single memory channel. Here, cDIMM 712 may be arranged with contact connections only on a bottom side of memory circuit board of the cDIMM, or on both a bottom side and on a top side of the memory circuit board, as needed or desired. The embodiment represented by information handling system 700 may be utilized for highly compact, low-cost systems.

In another embodiment, an information handling system 720 includes a processor 725, a pair of compression connectors 710, one mounted on a top side of a PCB 726, and the other mounted on a bottom side of the PCB, and into which a pair of cDIMMs 712 and 722 are mounted. Here, cDIMM 712 is mounted on the top side of PCB 726, and cDIMM 722 is mounted on the bottom side of the PCB. Here, both cDIMM 712 and cDIMM 722 are arranged such that only the contact connections associated with a single memory channel are used. However, cDIMM 712 is arranged differently from cDIMM 722, in that, where the DRAMs on cDIMM 712 are only accessed via the first memory channel, the DRAMs on cDIMM 722 are only accessed via the second memory channel. While the configuration illustrated by information handling system 720 may necessitate the provision of cDIMMs of differing types (i.e., "Channel A" cDIMMs and "Channel B" cDIMMs), the compactness and simplicity of design of the associated information handling system may be advantageous in certain designs. In anther embodiment, an information handling system 740 includes a processor 745, a pair of cDIMM compression connectors 750 and 754, and a pair of cDIMMs 752 and 756. Information handling system 740 is mechanically similar to information handling system 600, with compression connector 750 mounted to a PCB 758, into which cDIMM 752 is installed. Compression connector 754 is then mounted to the top side of cDIMM 752, into which cDIMM 756 is mounted. Here, in terms of connections to the DRAMs of cDIMMs 752 and 756, cDIMM 754 is similar to cDIMM 712, where the DRAMs on cDIMM 752 are only accessed via the first memory channel, and cDIMM 752 is similar to cDIMM 722, where the DRAMs on cDIMM 732 are only accessed via the second memory channel.

Figure 13:
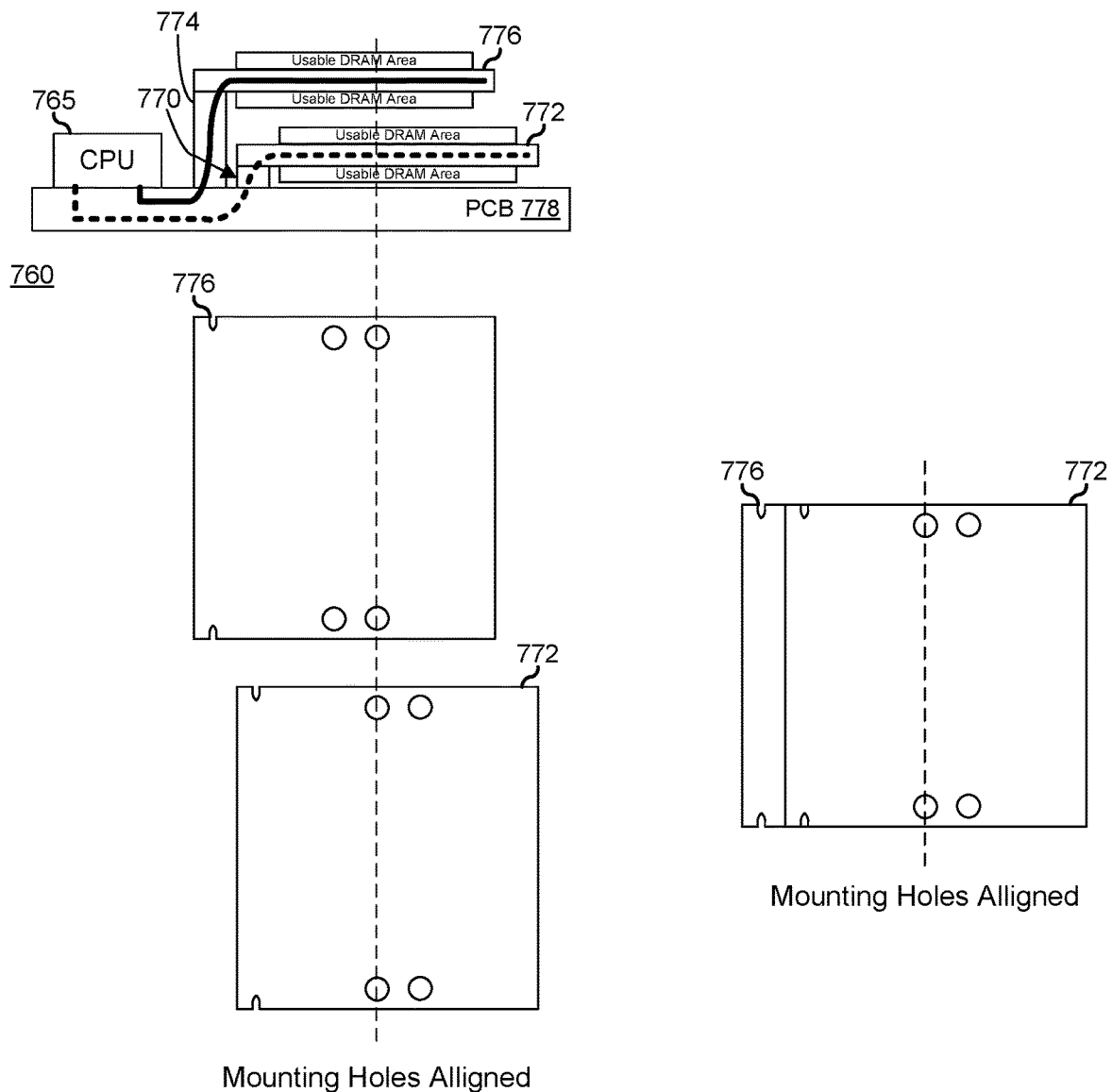
FIG. 13 is a block diagram illustrating an information handling system according to a further embodiment of the present disclosure.
Figure 13:
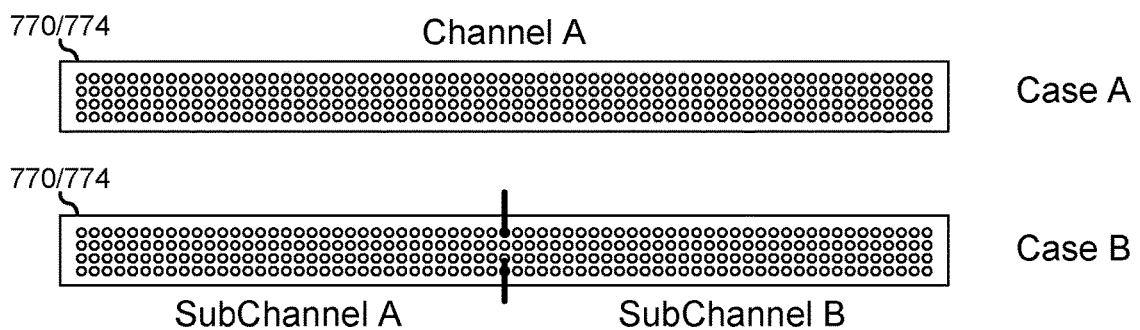

FIG. 13 illustrates an information handling system 760 that uses compression attached memory modules (CAMMs) that are arranged to only utilize one memory channel with CAMM compression connectors that only provide contact elements for one memory channel. Information handling system 760 includes a processor 765, a first CAMM compression connector 770 mounted onto a PCB 778, and into which a CAMM 772 is installed, and a second CAMM compression connector 774 mounted onto the PCB, and into which a CAMM 776 is installed. Each of CAMM compression connectors 770 and 774 provides a reduced footprint as compared to the CAMM compression connectors of the previously described embodiments. As such, CAMM compression connector 770 is mounted to PCB 778 at a first location on the surface of the PCB, and CAMM compression connector 774 is mounted to the PCB at a second location on the surface of the PCB that is offset from the first location. As a consequence, CAMMs 772 and 776 are not directly stacked upon a common footprint, but are offset from each other. CAMMs 772 and 776 are illustrated (without the included DRAM devices for clarity) as having offset pairs of mounting holes, where the pairs of the mounting holes are offset by the same distance that CAMM compression connectors 770 and 774 are offset from each other on PCB 778. In this way, when stacked, a first set of mounting holes of CAMM 772 are aligned with a second set of mounting holes of CAMM 776, as needed or desired.

As used herein, the illustrated CAMMs may be shown as providing memory access via one or two memory channels, including a first memory channel as depicted by a solid line from the associated processor to a first set of the DRAMs, and a second memory channel as depicted by a dashed line from the associated processor to a second set of the DRAMs. Such illustrations may be understood to represent earlier generation DDR topologies (such as DDR3 or DDR4), where each depicted memory channel represents a 64-bit memory channel. However, such illustrations may similarly be understood to represent later generation DDR topologies (such as DDR5), where each depicted memory channel represents dual 32-bit memory subchannels. Thus, for example, referring to FIG. 13, the first memory channel, depicted as a solid line from processor 785 to the DRAMs of CAMM 776, may represent a single 64-bit DDR channel for DDR3/4 topologies, or may represent dual 32-bit DDR5/6 subchannels for DDR5 topologies. Similarly, the second memory channel, depicted as a dashed line from processor 765 to the DRAMs of CAMM 772, may represent a single 64-bit DDR channel for DDR3/4 topologies, or may represent dual 32-bit DDR5/6 subchannels for DDR5 topologies.

As noted above, each of CAMM compression connectors 770 and 774 provides a reduced footprint, as illustrated in the bottom portion of FIG. 13, where the CAMM compression connectors include 5 row×67 column array of contact elements. In a first case, Case A, the signal contacts are shown for a single 64-bit memory channel (Channel A). In a second case, Case B, where CAMMs 770 and 774 represent fifth generation Double Data Rate (DDR5) CAMMs, the contact elements of CAMM compression connector 770 and 774 and the surface contact connections of the CAMMs include signaling for two memory subchannels. That is, each of the memory channel "A" and memory channel "B" are be divided functionally into two distinctly operating memory channels, hence memory channels A and B could be mirror-images of each other with respect to a middle column of the connector.

Figure 14:
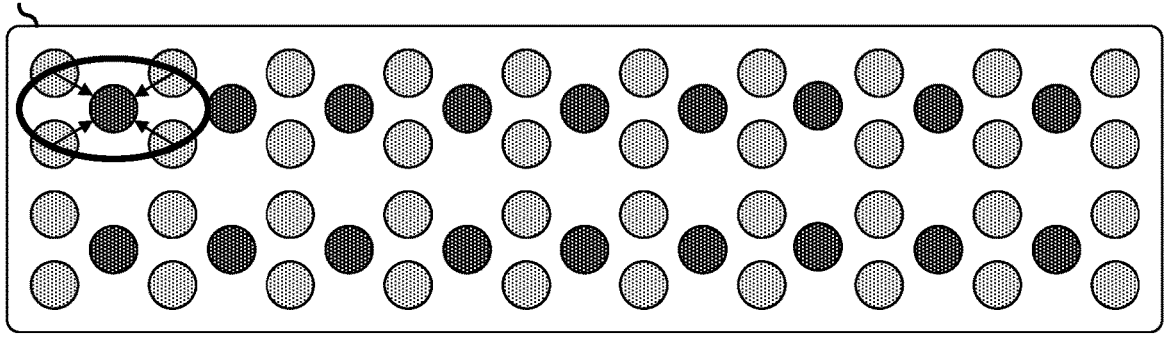
FIG. 14 illustrates compression connectors according to further embodiments of the current disclosure.
Figure 14:
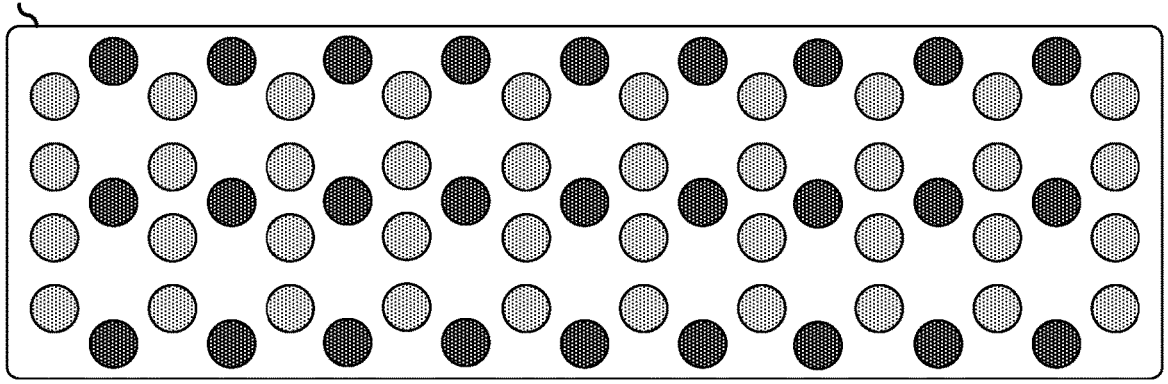
Figure 14:
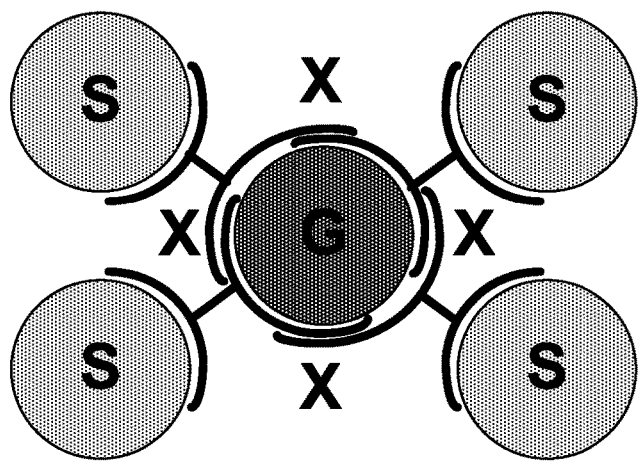

FIG. 14 illustrates compression connectors 1100 and 1102 as arranged in various cases. Compression connector 1100 includes 40 signal contacts, as illustrated by the lighter shaded contacts, and 18 signal return contacts, as illustrated by the darker shaded contacts. The signal contacts are arranged in four (4) rows by ten (10) columns, and the signal return contacts are arranged with two (2) signal return contacts situated between each column of signal contacts. Here, groupings of four (4) signal contacts share a common signal return contact, as illustrated by the circled set of five (5) contacts. Compression connector 1102 is arranged similarly to compression connector 1100, including 40 signal contacts, as illustrated by the lighter shaded contacts, and 27 signal return contacts, as illustrated by the darker shaded contacts. The signal contacts are arranged in four (4) rows by ten (10) columns, and the signal return contacts are arranged with three (3) signal return contacts situated between each column, such that groupings of either four (4) signal contacts or two (2) signal contacts are associated with a signal return contact.

In each case, the signal return contacts may be understood to represent grounded contacts, and, in each case, additional bulk power return contacts (not illustrated) may be provided, as needed or desired. As such, compression connectors 1100 and 1102 may be understood to be a simplified representations of compression connectors that may be utilized in the various embodiments of CAMMs as described herein. In particular, it will be understood that a compression connector for CAMMs may include additional contacts for providing power to the CAMMs, bulk ground return for the CAMMs, low-speed signaling contacts for low-speed interfaces such as I2C interfaces, I3C interfaces, serial presence detect (SPD) interfaces, and the like. Further, a compression connector for CAMMs may be understood to include various mounting structures such as through holes for rigidly affixing the compression connector/CAMM stack up to a PCB, registration or alignment structures to ensure correct alignment of the compression connector/CAMM stack up, or other structures as needed or desired. Such additional contacts and mounting structures are not illustrated herein for simplicity of illustration, and the compression connectors as illustrated herein should be understood to be highly stylized for the sake of clarity of description.

As the high-speed signaling frequency of memory architectures increases, a greater and greater portion of the signal return current in the signal return contacts is carried not by the bulk material of the signal return contacts, but is carried at the surface of the signal return contacts due to the electrical skin effect. Additionally, in order to reduce the overall size of compression connectors, the signal contacts are typically closely spaced. The increasing high-speed signaling frequency, combined with the close spacing of the signal contacts may result in increased crosstalk between the signal contacts. In an effort to reduce this crosstalk between the signal contacts, a compression connector can be fabricated with a metallic core that is covered by an insulating material such as a plastic material, and the metallic core can be grounded. Such a fabrication will be described further with respect to FIG. 15, below.

However, the provision of a metallic core for a compression connector does not typically fully mitigate the effects of crosstalk. In particular, the bottom portion of FIG. 14 illustrates a diagonal signal contact/signal return contact arrangement, including four (4) signal contacts and one (1) signal return contact in the center of the signal contacts. Each of the four (4) signal contacts utilizes the single signal return contact to provide a return path for the associated signal. That is, each signal contact shares the common signal return contact. Due to the high signaling frequency, the signal and return currents for each signal contact are primarily carried at the surface of each signal contact/signal return contact pair. However, as illustrated, a portion of the return current carried in the signal return contact for a particular one of the signal contacts overlaps with the return current carried in the signal return contact for each signal contact adjacent to the particular one signal contact. This overlap is indicated for each pair of signal contacts be the "X" located near the overlapping currents. Such overlapping signal return currents in the signal return contact induces unwanted currents in the signal contacts, resulting in added crosstalk between the signal contacts.

Figure 15:
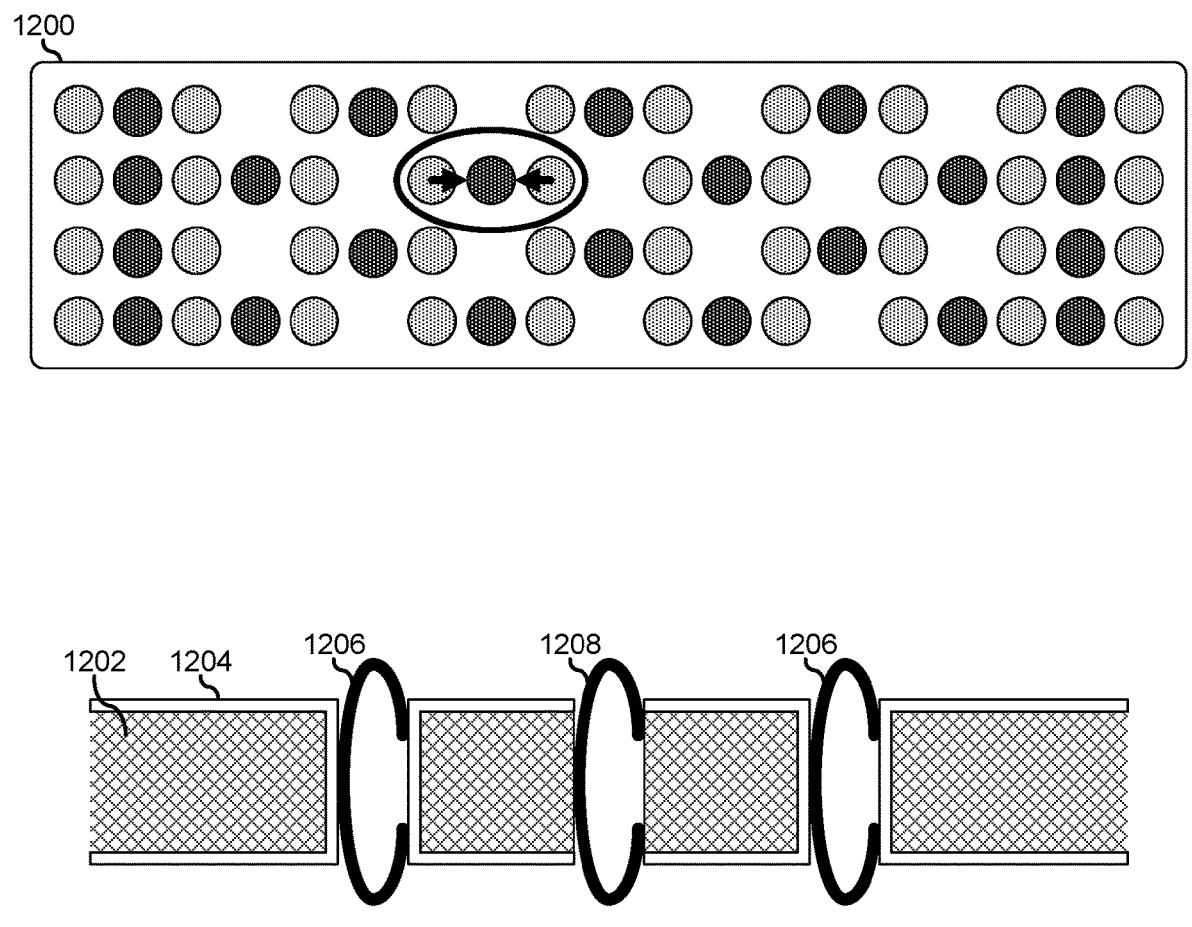
FIG. 15 illustrates a compression connector according to another embodiment of the current disclosure.

FIG. 15 illustrates a compression connector 1200 that includes 40 signal contacts, as illustrated by the lighter shaded contacts, and 22 signal return contacts, as illustrated by the darker shaded contacts. The signal contacts are arranged in four (4) rows by ten (10) columns, and the signal return contacts are arranged with two (2) signal return contacts situated between each column of signal contacts, except that four (4) signal return contacts are situated between the outermost columns of signal contacts and their adjacent columns of signal contacts. Linear groupings of two (2) signal contacts share a common signal return contact, as illustrated by the circled set of three (3) contacts. The signal return contacts may be understood to represent grounded contacts, and, in each case, additional bulk power return contacts (not illustrated) may be provided, as needed or desired. As such, compression connector 1200 may be understood to be a simplified representations of compression connectors that may be utilized in the various embodiments of CAMMs as described herein, and the compression connector may be further understood to include additional contacts and mounting features, as described above.

A cross section of a linear pair of signal contacts and their associated signal return contact is illustrated in the bottom portion of FIG. 15. Compression connector 1200 includes a metallic core 1202 that is covered by an insulating material 1204. Holes in compression connector 1200 are provided and contact elements are inserted into the holes. Signal contacts 1206 are illustrated with insulating material 1204 covering the sides of the holes, to isolate the signal contacts from metallic core 1202. Signal return contact 128 is illustrated with no insulating material 1204, but with the signal return contact making an electrical connection with metallic core 1202 in order to ground the metallic core. Additional ground contacts for bulk current return will likewise be in electrical connection with metallic core 1202. In this way, metallic core 1202 represents a large ground plane that reduces crosstalk between signal return contacts 1206 and their adjacent signal return contacts. Signal contacts 1206 and signal return contact 1208 may represent pin-based contacts. spring-based contacts, or other types of contacts, as needed or desired. Contacts 1206 and 1208 are configured to make sound electrical connections with matching contact pads on the surface of the PCB to which compression connector 1200 is affixed, and with matching contact pads on the surface of the CAMM which is affixed to the compression connector.

Figure 16:
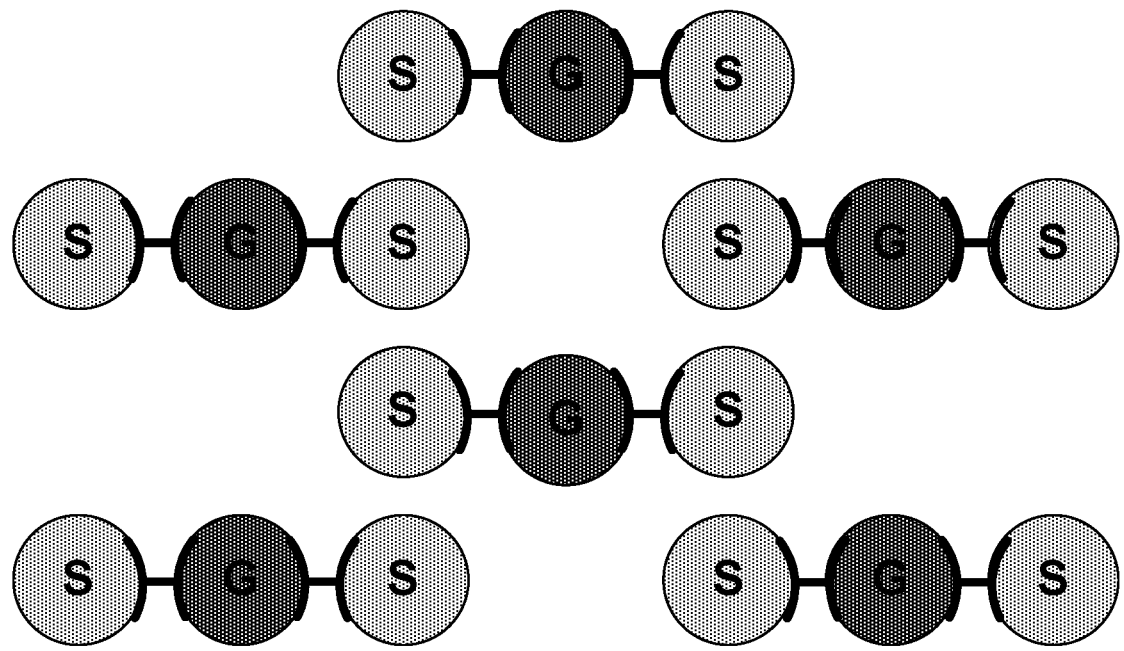
FIG. 16 illustrates signal return current coupling in the compression connector of FIG. 15.
Figure 16:
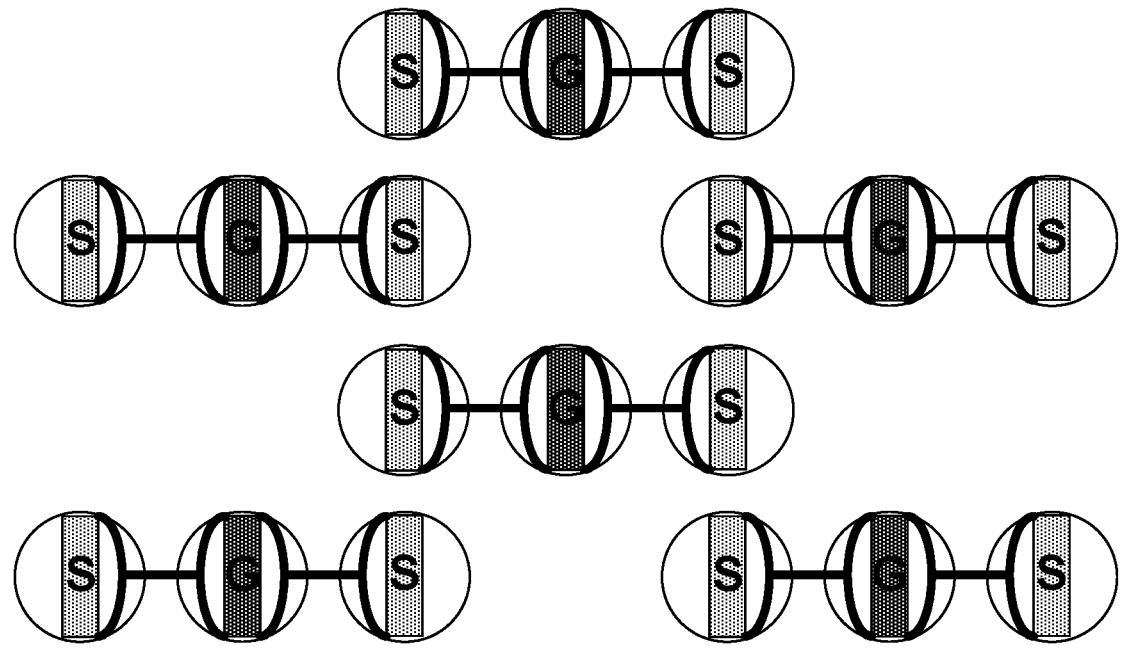

FIG. 16 illustrates the signal contact/signal return contact arrangement of compression connector 1200, and includes six (6) linear sets of two (2) signal contacts and one (1) signal return contact. For each linear set, the two (2) signal contacts utilize the associated signal return contact to provide a return path for the associated signal. That is, only two (2) signal contact share a common signal return contact. Due to the high signaling frequency, the signal and return currents for each signal contact are primarily carried at the surface of each signal contact/signal return contact pair. However, in contrast to the arrangements as shown in FIG. 14, the illustrated linear sets show that the portion of the return current carried in the signal return contact for a first one of the signal contacts does not overlap with the return current carried in the signal return contact for the other signal contact of the set.

Thus the arrangement of linear signal contact/signal return contact sets with two (2) linear signal contacts and one (1) signal return contact further reduces unwanted currents in the signal contacts, resulting in less crosstalk between the signal contacts. The top portion of FIG. 16 illustrates the coupling of linear signal contact/signal return contact sets where the signal contacts are pin-type signal contacts. The bottom portion of FIG. 16 illustrates the coupling of linear signal contact/signal return contact sets where the signal contacts are spring-type signal contacts. Because spring-type contacts have a generally flatter profile than pin-type contacts, the isolation between the return currents may be understood to be even better with spring-type than the isolation provided by pin-type contacts. The compression connector may be assembled such that a major surface of the spring-type contacts are aligned vertically so as to present the major surfaces of the signal contacts and the signal return contacts facing towards each other.

In a particular example, the diagonal arrangement as shown in FIG. 14 was simulated to exhibit 435 millivolt (mV) of crosstalk in the signal return contact when the signal contacts were driven with a 1 gigaHertz (gHz) square wave signal, while the linear arrangement of FIG. 15 was simulated to exhibit 260 mV of crosstalk in the signal return contact when the signal contacts were driven with a 1 gHz square wave signal. The liner signal contact/signal return contact arrangement provides greater immunity to crosstalk in the signal return contact than the diagonal signal contact/return contact arrangement. While the diagonal signal contact/return contact arrangement and the linear signal contact/return contact arrangement were described with reference to a compression connector, the benefits of reduced crosstalk in a signal return contact are not limited thereto, but may likewise be beneficial in other types of high-speed signal packaging, as needed or desired. For example, ball-grid array packages, pin-grid array packages, or other types of densely populated signal packaging may likewise benefit from the use of linear signal contact/return contact arrangement, as needed or desired.

Figure 12:
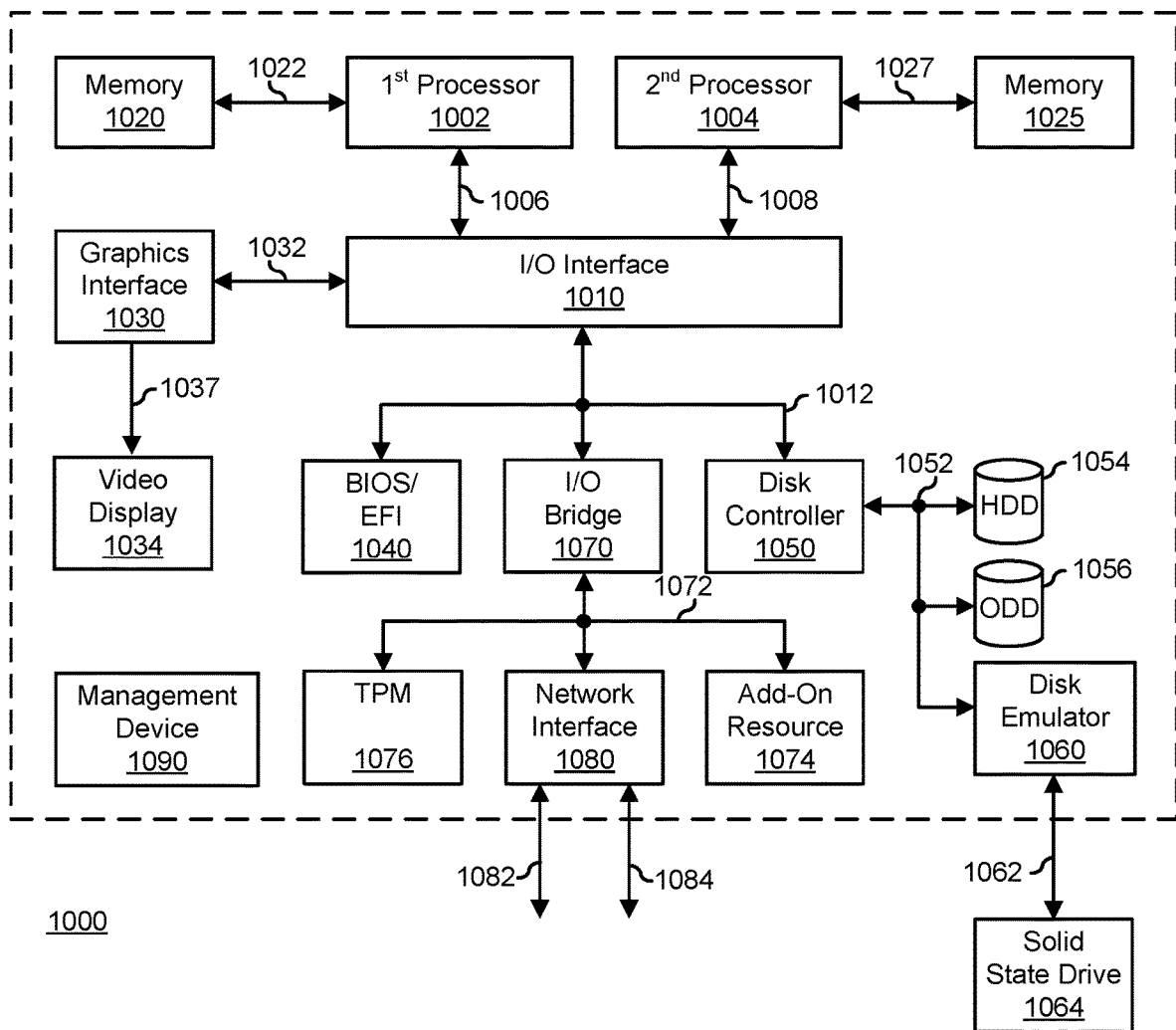
FIG. 12 is a block diagram illustrating a generalized information handling system according to another embodiment of the present disclosure.

FIG. 12 illustrates a generalized embodiment of an information handling system 1000 similar to information handling system 100. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components.

Information handling system 1000 can include devices or modules that embody one or more of the devices or modules described below, and operates to perform one or more of the methods described below. Information handling system 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1062, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1062, I/O bridge 1070, add-on resources 1074, TPM 1076, and network interface 1080 operate together to provide a host environment of information handling system 1000 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via a memory interface 1027. Graphics interface 1030 is connected to I/O interface 1010 via a graphics interface 1032, and provides a video display output 1036 to a video display 1034. In a particular embodiment, information handling system 1000 includes separate memories that are dedicated to each of processors 1002 and 1004 via separate memory interfaces. An example of memories 1020 and 1030 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1010 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 1040 includes BIOS/UEFI code operable to detect resources within information handling system 1000, to provide drivers for the resources, initialize the resources, and access the resources. BIOS/UEFI module 1040 includes code that operates to detect resources within information handling system 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to information handling system 1000 via an external interface 1062. An example of external interface 1062 includes a USB interface, an IEEE 1394 (Firewire) interface, a proprietary interface, or a combination thereof. Alternatively, solid-state drive 1064 can be disposed within information handling system 1000.

I/O bridge 1070 includes a peripheral interface 1072 that connects the I/O bridge to add-on resource 1074, to TPM 1076, and to network interface 1080. Peripheral interface 1072 can be the same type of interface as I/O channel 1012, or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as I/O interface 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1000, such as system cooling fans and power supplies. Management device 1090 can include a network connection to an external management system, and the management device can communicate with the management system to report status information for information handling system 1000, to receive BIOS/UEFI or system firmware updates, or to perform other task for managing and controlling the operation of information handling system 1000. Management device 1090 can operate off of a separate power plane from the components of the host environment so that the management device receives power to manage information handling system 1000 when the information handling system is otherwise shut down. An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1090 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a first z-axis compression connector having a first depth;
a first memory module;
a second z-axis compression connector having a second depth that is greater than the first depth;
a second memory module; and
a printed circuit board, wherein a first side of the first compression connector is affixed to the printed circuit board at a first location, a first surface of a first memory circuit board of the first memory module is affixed to a second side of the first compression connector, a first side of the second compression connector is affixed to the printed circuit board at a second location adjacent to the first location, and the first side of a second memory circuit board of the second memory module is affixed to a second side of the second compression connector;
wherein the first memory module is accessed via a first memory channel of the information handling system and the second memory module is accessed via a second memory channel of the information handling system.

2. The information handling system of claim 1, wherein:
the first compression connector includes an array of first contact elements on the second side of the first compression connector;
the first memory module includes an array of first surface contact connections on the first surface of the first memory circuit board, wherein each first surface contact connection is configured to be engaged with an associated one of the first contact elements the second compression connector includes an array of second contact elements on the second side of the second compression connector; and the second memory module includes an array of second surface contact connections on the first surface of the second memory circuit board, wherein each second surface contact connection is configured to be engaged with an associated one of the second contact elements.

3. The information handling system of claim 2, wherein:
the first memory module includes a plurality of first memory devices mounted on at least one of the first and second surfaces of the first memory circuit board;
the second memory module includes a plurality of second memory devices mounted on at least one of the first surface and a second surface of the second memory circuit board;
the first memory devices are arranged to be accessed via the first memory channel; and
the second memory devices are arranged to be accessed via the second memory channel.

4. The information handling system of claim 3, wherein the first memory channel includes two memory subchannels.

5. The information handling system of claim 4, wherein a first set of the first surface contact connections associated with a first one of the memory subchannels is arranged as a mirror image of a second set of first surface contact connections associated with a second one of the memory subchannels with respect to a middle row of the surface contact connections.

6. The information handling system of claim 4, wherein a first set of the first surface contact connections associated with a first one of the memory subchannels is arranged as a mirror image of a second set of first surface contact connections associated with a second one of the memory subchannels with respect to a middle column of the surface contact connections.

7. The information handling system of claim 3, wherein the first and second memory modules are each fifth generation Double Data Rate memory modules.

8. The information handling system of claim 1, wherein the first location is offset from the second location by a predetermined distance.

9. The information handling system of claim 8, wherein the first and second memory modules each include a first mounting hole and a second mounting hole that is offset from the first mounting hole by the predetermined distance.

10. The information handling system of claim 9, wherein the first memory module and the second memory module are mounted together to the printed circuit board through the first mounting hole of the first memory module and the second mounting hole of the second memory module.

11. A method, comprising:
affixing a first side of a first z-axis compression connector to a printed circuit board of an information handling system at a first location, the first compression connector having a first depth;
affixing a first surface of a first memory circuit board of a first memory module to a second side of the first compression connector;
affixing a first side of a second z-axis compression connector to the printed circuit board at a second location adjacent to the first location, the second compression connector having a second depth that is greater than the first depth; and affixing a first surface of a second memory circuit board of a second memory module to a second side of the second compression connector;
wherein the first memory module is accessed via a first memory channel of the information handling system and the second memory module is accessed via a second memory channel of the information handling system.

12. The method of claim 11, further comprising:
providing, on the second side of the first compression connector, an array of first contact elements;
providing, on the first side of the first memory circuit board, an array of first surface contact connections, wherein each first surface contact connection is configured to be engaged with an associated one of the first contact elements;
providing, on the second side of the second compression connector, an array of second contact elements; and
providing, on the first surface of the second memory circuit board, an array of second surface contact connections, wherein each second surface contact connection is configured to be engaged with an associated one of the third contact elements.

13. The method of claim 12, further comprising:
mounting, on at least one of the first and second surfaces of the first memory circuit board, a plurality of first memory devices;
mounting, on at least one of the first and second surfaces of the second memory circuit board, a plurality of second memory devices;
accessing, via the first memory channel, the first memory devices; and
accessing, via the second memory channel, the second memory devices.

14. The method of claim 13, wherein the first memory channel includes two memory subchannels.

15. The method of claim 14, further comprising:
arranging a first set of the first surface contact connections associated with a first one of the memory subchannels as a mirror image of a second set of first surface contact connections associated with a second one of the memory subchannels with respect to a middle row of the surface contact connections.

16. The method of claim 14, further comprising:
arranging a first set of the first surface contact connections associated with a first one of the memory subchannels as a mirror image of a second set of first surface contact connections associated with a second one of the memory subchannels with respect to a middle column of the surface contact connections.

17. The method of claim 13, wherein the first and second memory modules are each fifth generation Double Data Rate memory modules.

18. The method of claim 11, wherein:
the first location is offset from the second location by a predetermined distance; and
the first and second memory modules each include a first mounting hole and a second mounting hole that is offset from the first mounting hole by the predetermined distance.

19. The method of claim 18, wherein the first memory module and the second memory module are mounted together to the printed circuit board through the first mounting hole of the first memory module and the second mounting hole of the second memory module.

20. An information handling system, comprising:
a processor;

a first z-axis compression connector having a first depth;
a first memory module including a plurality of first memory devices mounted on at least one of a first surface and second surface of a first memory circuit board of the first memory module;
a second z-axis compression connector having a second depth that is greater than the first depth;
a second memory module including a plurality of second memory devices mounted on at least one of a first surface and second surface of a second memory circuit board of the second memory module; and
a printed circuit board, wherein a first side of the first compression connector is affixed to the printed circuit board at a first location, the first surface of the first memory circuit board is affixed to a second side of the compression connector, a first side of the second compression connector is affixed to the printed circuit board at a second location adjacent to the first location, and the first side of the second memory circuit board is affixed to a second side of the second compression connector;
wherein the processor accesses the first memory devices via a first memory channel and accesses the second memory devices via a second memory channel.

* * * * *